(12) United States Patent
Kuniyasu et al.

(10) Patent No.: US 6,738,403 B2
(45) Date of Patent: May 18, 2004

(54) SEMICONDUCTOR LASER ELEMENT AND SEMICONDUCTOR LASER

(75) Inventors: Toshiaki Kuniyasu, Kaisei-machi (JP); Toshiro Hayakawa, Kaisei-machi (JP); Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 96 days.

(21) Appl. No.: 09/826,851

(22) Filed: Apr. 6, 2001

(65) Prior Publication Data

US 2002/0018499 A1 Feb. 14, 2002

(30) Foreign Application Priority Data

Apr. 6, 2000 (JP) ........................... 2000-104902
Apr. 17, 2000 (JP) ........................... 2000-114614
Sep. 11, 2000 (JP) ........................... 2000-274774

(51) Int. Cl.$^7$ .............................. H01S 5/00; H01S 3/04
(52) U.S. Cl. .............................. 372/43; 372/34; 372/36
(58) Field of Search .................... 372/43.46, 36, 372/34

(56) References Cited

U.S. PATENT DOCUMENTS

| | | | | |
|---|---|---|---|---|
| 5,608,749 A | * | 3/1997 | Kizuki | 372/36 |
| 6,108,361 A | * | 8/2000 | Fujihara et al. | 372/46 |
| 6,239,033 B1 | * | 5/2001 | Kawai | 438/693 |
| 6,281,524 B1 | * | 8/2001 | Yamamoto et al. | 257/99 |
| 6,597,716 B1 | * | 7/2003 | Takatani | 372/46 |
| 2001/0048114 A1 | * | 12/2001 | Morita et al. | 372/43 |

OTHER PUBLICATIONS

Appl. Phys. Lett. 72 (1), Jan. 5, 1998, ":6.1 W continuous wave front–facet power from Al–free active–region ($\lambda$=805 nm) diode lasers", J.K. Wade, et al.

Jpn. J. Appl. Phys. vol. 34 (1995) pp. L1175–L1177 Part 2, No. 9B, Sep. 15, 1995, "Highly Reliable Oper ation of High–Power InGaAsP/InGaP/AlGaAs 0.8 $\mu$m Separate Confinement Heterostructure Lasers", Toshiaki Fukunaga, et al.

IEEE Journal of Quantum Electronics, vol. 28., No. 4, Apr. 1992, "Modular Microchannel Cooled Heatsinks for High Average Power Laser Diode Arrays", Ray Beach, et al.

Jpn. J. Appl. Phys. vol. 37 (1998) pp. L1020–L1022 Part. 2, No. 9A/B, Sep. 15, 1998, "InGaN/GaN/AlGaN–Based Laser Diodes Grown on GaN Substrates with a Fundamental Transverse Mode", Shuji Nakamura, et al.

* cited by examiner

*Primary Examiner*—Paul Ip
*Assistant Examiner*—James Menefee
(74) *Attorney, Agent, or Firm*—Sughrue Mion, PLLC

(57) ABSTRACT

In a semiconductor laser element having a plurality of semiconductor layers formed on a substrate, a groove-form concave portion is formed on the surface of the substrate opposite to the surface having the semiconductor layers. The concave portion is filled with metal having a higher heat conductivity higher than the substrate. The semiconductor laser element achieves improved heat dissipation characteristics and high reliability even under high-output operation.

10 Claims, 21 Drawing Sheets

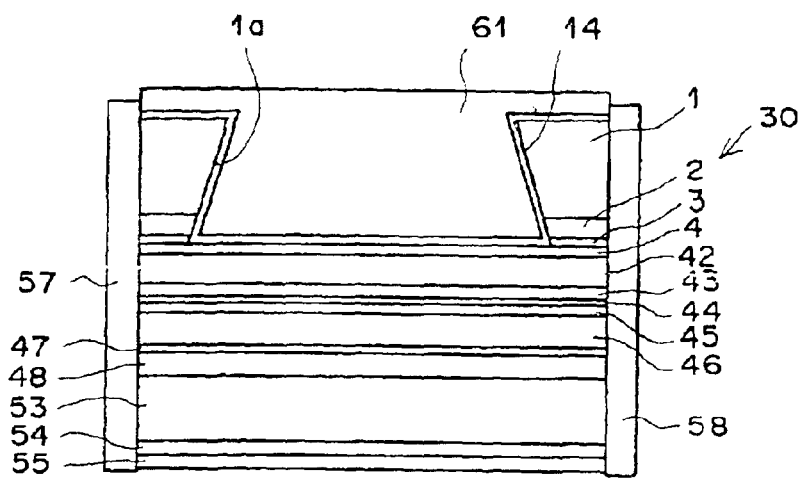
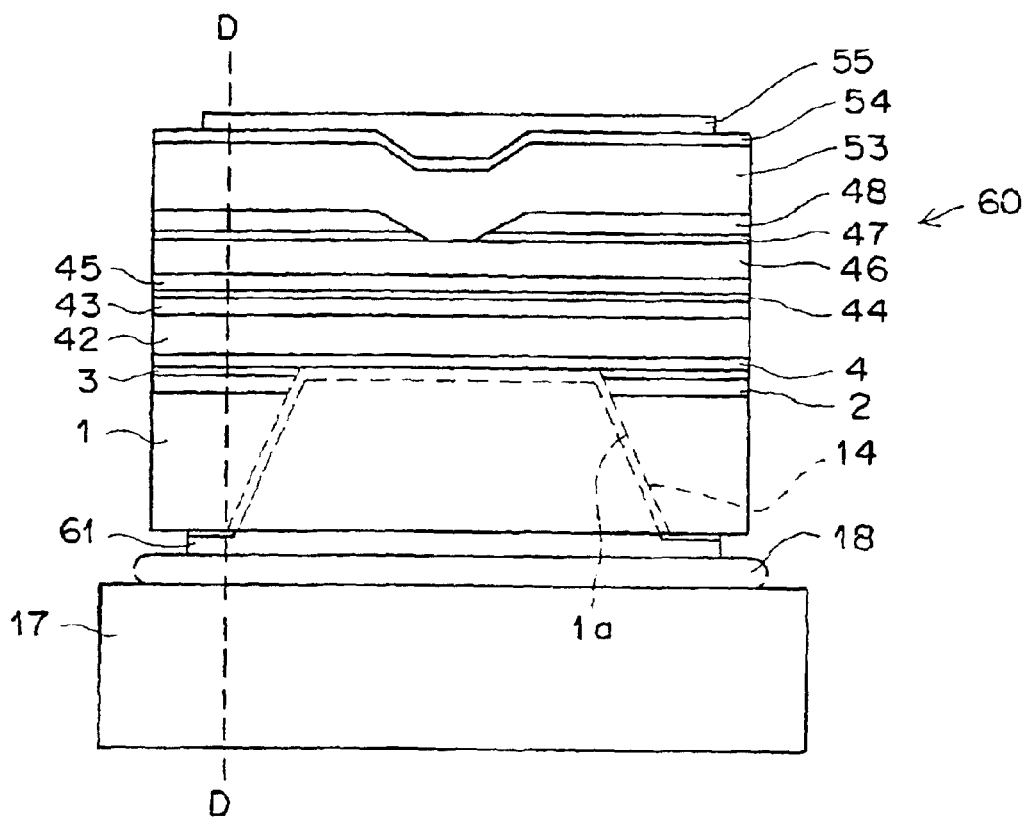

F I G . 14
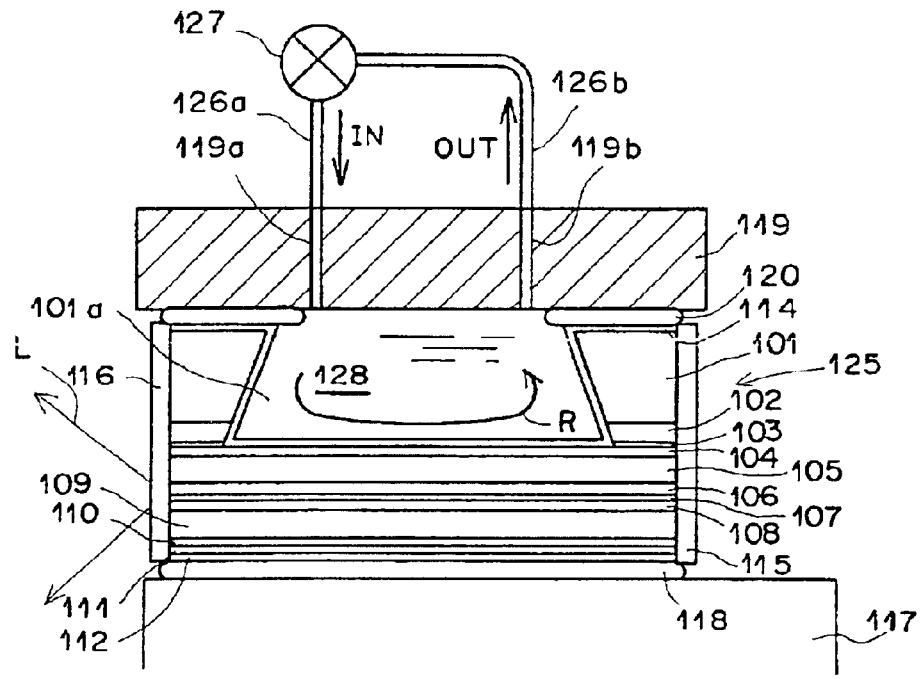
F I G . 15
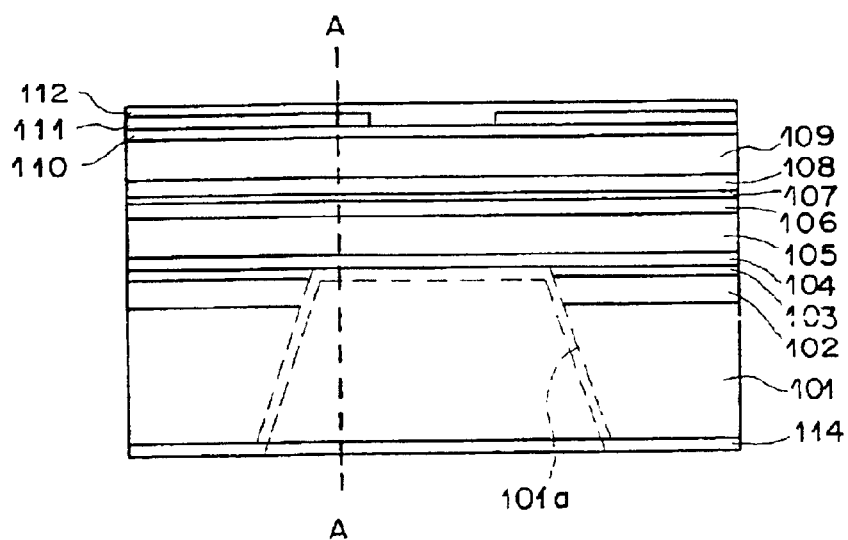

F I G . 16
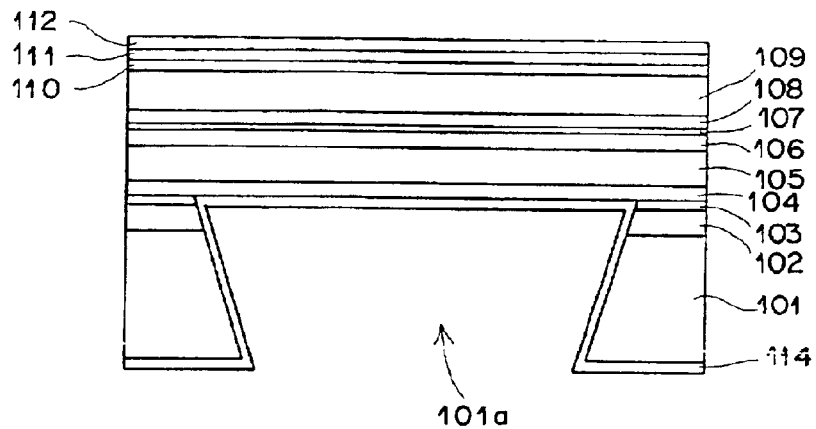
F I G . 17
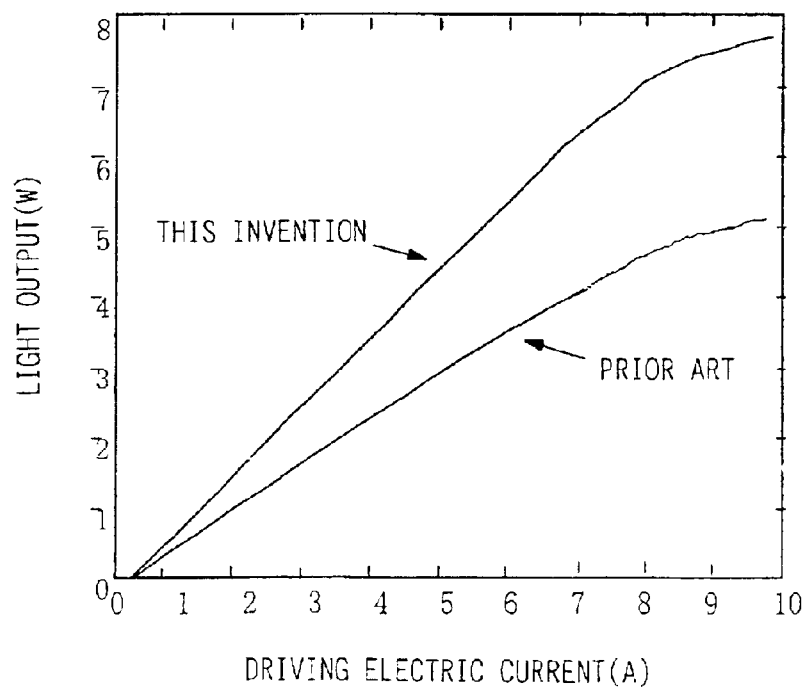

SEMICONDUCTOR LASER ELEMENT AND SEMICONDUCTOR LASER

BACKGROUND OF THE INVENTION

1. Field of the Invention

The present invention relates to a semiconductor laser element and a semiconductor laser, and more specifically to a semiconductor laser element and a semiconductor laser having an improved heat dissipation characteristic. The present invention also relates to a semiconductor laser element comprising a GaN-base semiconductor and to a semiconductor laser provided with such a semiconductor laser element.

2. Description of the Prior Art

Recently, the use of semiconductor lasers has been expanding remarkably In many of these uses, there has been a demand for a semiconductor laser with higher output. Accordingly, for realizing higher output of a semiconductor laser, various attempts have been made to improve the structure of the semiconductor laser element itself. For example, reported in Literature 1), J. K. Wada et al, "6.1 W continuous wave front-facet power from Al-free active-region ($\lambda$=805 nm) diode lasers", Applied Physics Letters, Vol. 72, No. 1 (1998) pp. 4–6, is a semiconductor laser having an active layer made of InGaAsP containing no Al, an optical waveguide layer made of Ingap, and a clad layer made of InAlGap, and oscillating in a 805 nm band.

Suggested in Literature 1) as the structure for lowering the photodensity of the active layer to improve the high output characteristic is an LOC (Large Optical Cavity) structure with widened thickness of the optical waveguide layer. The increase of the maximum light output thereby is reported.

Also known as the semiconductor laser having an active layer with no Al and oscillating in a 0.8 $\mu$m band is a semiconductor laser having, on an n-GaAs substrate, an n-AlGaAs clad layer, an i-InGaP optical waveguide layer, an InGaAsP quantum well active layer, an i-InGaP optical waveguide layer, a p-AlGaAs clad layer, and a p-GaAs cap layer, as shown in Literature 2); T Fukunaga et al. "Highly Reliable Operation of High-Power InGaAsP/InGaP/AlGaAs 0.8 $\mu$m Separate Confinement Hetrostructure Lasers", Jpn. J. Appl. Phys. Vol. 34, (1995) pp. L1175–1177.

Also, to improve the heat dissipation effect of a semiconductor laser element, various structures of forcibly cooling the device with a cooling medium such as water have already been proposed. For example, proposed in Literature 3), Ray Beach et al., "Modular Michrochannel Cooled Heatsinks for High Average power Laser Diode", IEEE JOURNAL OF QUANTUM ELECTRONICS, Vol. 28. No. 4, April 1992, is a structure of a water-cooling mechanism for a semiconductor laser element using a microchannel.

On the other hand, about a semiconductor laser of a 400 nm band having a fine spot, required in the field of printing, etc., using an optical disk memory and a photosensitive material, is a beam having a high reliability and a high quality which oscillates in the optical density fundamental transverse mode with a Gauss distribution so as to fit for the increase of the image density and the increase of the image quality. For example, reported in Nakamura et al., Literature 4) InGaN/GaN/AlGaN-Based Laser Diodes Grown on GaN Substrates with a Fundamental Transverse Mode, described in "Jpn. J. Appl. Phys. Lett., Vol. 37, pp. L1020, is a semiconductor laser obtained by depositing an n-GaN buffer layer, an n-InGaN clack-preventing layer, an n-AlGaN/GaN-modulated dope supper lattice clad layer, an n-GaN optical waveguide layer, an m-InGaN/InGaN multiple quantum well active layer, a p-AlGaN carrier block layer, a p-AlGaN/GaN modulated dope super lattice clad layer, and a p-GaN contact layer on a GaN substrate, the Gan substrate being obtained by forming a GaN layer on a sapphire substrate utilizing the selective growth using $SiO_2$ as a mask and by releasing the GaN layer and a part of the sapphire substrate as the Gan substrate.

However, the structure shown in Literature 1) may lead to a phenomenon of COMD (Catastrophic optical mirror damage), where the end face of the device is damaged because of temperature increase of the end face triggered by an electric current generated by the light absorption at the end face, and because of smaller bandgap which increases light absorption at the end face. Therefore, the maximum light output is restrained to avoid the COMD. Since the light output which may trigger the COMD changes time-by-time, it sometimes happens that the operation of the semiconductor laser is suddenly stopped. As a result of such circumstances, it is difficult to obtain a high reliability at the time of a high output driving in the semiconductor laser proposed by Literature 1).

Also, in the semiconductor laser shown in Literature 2), the maximum light output is considerably low, in fact as low 1.8 W.

Furthermore, in the structure described in Literature 3) above, there is a problem that a large-scale cooling mechanism is required even in the case of cooling a single semiconductor device. Such a large scale cooling mechanism also requires a large place. Another problem is that it is difficult to obtain the sufficient cooling effect required for the recent high-output laser element because cooling is indirectly carried out from one surface connected to a module.

On the other hand, in the semiconductor device described in Literature 4), the reduction of the element resistance is attempted using a modulation dope super lattice clad layer but the reduction is not insufficient. Thus, the deterioration of the reliability due to the joule heat occurs during operation. Also, the resistance of the element is high in the semiconductor laser comprised of the semiconductor layers of the above-described system. Therefore, particularly in the laser of a single mode where the contact area with the contact layer is narrow, the influence of heat generation becomes a problem in practical use. The generation of the joule heat is coped with by cooling using a heatsink, etc. However, in the structure of the above-described semiconductor device, the heat dissipation is insufficient, because a heatsink is formed on the n-GaN layer exposed by etching the side surface of the semiconductor laser device making the form of the device complicated. That is, cooling from the p-electrode side near the active layer generating heat is difficult, and only cooling from the n-electrode side far from the active layer is possible. Also, because the p-electrode and the n-electrode are not disposed in a vertical direction but are disposed to the right and left, the stream of the electric current injected from the p-electrode is not straight but is liable to become inhomogeneous, whereby a uniform light emission where the optical density is a Gauss-type distribution cannot be obtained. For obtaining the light emission of a Gauss-type distribution, it is necessary to make the ridge width as narrow as possible. However, when the ridge width is narrowed, there is a problem that increase of the output is difficult.

SUMMARY OF THE INVENTION

The present invention has been made in view of the above-described circumstances and an object of the invention is to provide a semiconductor laser element having a high reliability even under high output.

Also, in view of the above-described circumstances, another object of the invention is to provide a semiconductor laser having a high reliability even under high output by improving the heat dissipation of a semiconductor laser element.

Furthermore, in view of the above-described circumstances, still another object of the invention is to provide a semiconductor laser element and a semiconductor laser, which realize a uniform and high-quality beam having the optical density of a Gauss-type distribution and thus have a high reliability under high output, by improving the heat dissipation and by making the injection of an electric current into the active layer uniform.

That is, the semiconductor laser element according to the first aspect of the invention is a semiconductor laser element having a plurality of semiconductor layers formed on a substrate, comprising a concaved portion formed on a surface of the substrate, said surface being opposite to the surface having the semiconductor layers formed thereon, wherein a metal having a higher heat conductivity than the substrate is filled in the concaved portion.

Also, the semiconductor laser element according to the second aspect of the invention is a semiconductor laser element having a plurality of semiconductor layers formed on a substrate, comprising a concaved portion formed at least in a part of a surface of the semiconductor layer, said surface being opposite to the surface on the side of the substrate, wherein a metal having a higher heat conductivity than the semiconductor layer is filled in the concaved portion.

In addition, it is desirable that in the semiconductor laser element of the second aspect, as well as the semiconductor laser element of the first aspect, another concaved portion is formed on a surface of the substrate opposite to the surface having the semiconductor layers formed thereon, and that a metal having a higher heat conductivity than the substrate is filled in the concaved portion.

Also, in the semiconductor laser elements of the invention described above, it is desirable that the concaved portion formed the substrate on the semiconductor layer has a reverse mesa form with respect to the direction perpendicular to the light-emitting face.

Also, it is desirable that a heatsink is bonded to the metal filled in the concaved portion.

Furthermore, it is desirable that in the semiconductor laser elements of the invention described above, plural light-emitting portions are formed on the semiconductor layer to constitute a semiconductor laser array.

Moreover, it is desirable that the semiconductor laser elements of the invention described above are used as the light sources for exciting a solid laser.

In the semiconductor laser elements according to the first aspect of the invention described above, where a metal having a higher heat conductivity than the substrate is filled in the concaved portion formed on the substrate, the heat generated at the active layer and the vicinity thereof is dissipated through the metal more efficiently than through the substrate only. Thus, the temperature of the semiconductor laser element (more practically, the temperature in the vicinity of the active layer) is kept low, whereby a high reliability is insured even under a high output operation.

Also in the semiconductor laser element according to the second aspect of the invention, where a metal having a higher heat conductivity than the semiconductor layer is filled in the concaved portion formed on the semiconductor layer, the heat generated at the active layer and the vicinity thereof is dissipated through the metal more efficiently than through the semiconductor layer only. Thus, in the construction, the temperature of the semiconductor laser element (more practically, the temperature in the vicinity of the active layer) is kept low, whereby a high reliability is insured even under a high output operation.

Also, in the case where the semiconductor laser element of the second aspect has the concaved portion which is filled with a metal having a higher heat conductivity than the substrate and which is formed in the substrate as in the case of the semiconductor laser element of the first aspect, the heat dissipating effect from the substrate side is also improved. Thus, the temperature of the semiconductor laser element is kept lower, and still higher reliability is insured under a high output operation.

Also, in the case where the semiconductor laser elements of the invention described above have the concaved portions formed in reverse mesa forms on the substrate and the semiconductor layer, the above-described metal can be arranged up to the portion closer the light-emitting face of the semiconductor laser element. Thus, the light-emitting face, which is liable to become high temperature, can be effectively cooled.

Furthermore, in the semiconductor laser elements of the invention described above having a heatsink bonded to the metal filled in the concaved portion, the heat conducted through the metal can be efficiently dissipated via the heatsink in a three-dimensional manner, whereby a higher reliability can be obtained even under a high output operation.

On the other hand, the semiconductor laser device according to the third aspect of the invention is comprised of a semiconductor laser element, a heatsink disposed in contact with the semiconductor laser element, a cooling medium passageway formed between the heatsink and the semiconductor laser element using at least a part of each of them as a passageway wall, and means for transferring a cooling medium through the cooling medium passageway.

In addition, the term "a cooling medium passageway is formed between the heatsink and the semiconductor laser element" as described above does not always mean that the cooling medium passageway is formed separately from the heatsink but also includes the state where the cooling medium passageway is formed using a part of the heatsink and the cooling medium passageway covers the area from the rest portion of the heatsink to the semiconductor laser element.

In the above-described construction, it is desirable that the heat sink includes a first heatsink disposed in contact with the substrate of the semiconductor laser element and a second heatsink disposed in contact with the surface of the semiconductor laser element opposite to the substrate side, wherein passageways are respectively formed between each of the first and second heatsinks and the semiconductor laser element first and second cooling medium.

Also, it is preferred that at least a part of the cooling medium passageway is constituted of the groove formed in the substrate of the semiconductor laser element. Also, it is preferred that the groove formed in the substrate is formed in a reverse mesa form. Furthermore, at least a part of the cooling medium passageway may be constituted of a ridge groove formed on the surface of the semiconductor laser element opposite to the substrate.

Also, it is desirable that the wall portion of the groove formed on the semiconductor laser element as described above is coated with a dielectric film such as an $SiO_2$ film, an SiN film, an $Al_2O_3$ film, etc.

On the other hand, it is desirable that in the heatsink there are formed a supply passageway for supplying a cooling medium to the above-described cooling medium passageway by connecting thereto and/or a discharge passageway for discharging the cooling medium from the cooling medium passageway.

Also, it is desirable that the heatsink is bonded to the semiconductor laser element using a brazing material having a resistance to the cooling medium.

Furthermore, it is desirable that in the semiconductor laser described above, plural semiconductor laser elements are formed to construct a semiconductor laser array and, on the other hand, the cooling medium passageway connects each of the plural semiconductor laser elements and the heatsink.

Also, it is desirable that the semiconductor laser element (s) constituting the semiconductor laser of the invention are used as the light sources for exciting a solid laser.

Because, in the semiconductor laser of the invention described above, the cooling medium passageway is formed between the heatsink and the semiconductor laser element using at least a part of each of the heatsink and the semiconductor laser element as the wall of the passageway and the apparatus is constructed such that a cooling medium flows through the cooling medium passageway, the cooling medium flows while directly contacting with the semiconductor laser element and the heatsink. Thus, the heat dissipation from the semiconductor laser element to the heatsink is carried out sufficiently well via the cooling medium, the heat-dissipating characteristics of the semiconductor laser element (more practically, the vicinity of the active layer) are improved, and a high reliability is insured even under a high-output operation.

In addition, in the case where the semiconductor laser of the invention described above has the first and second heatsinks formed as described above, and where first and second cooling medium passageways are formed between the semiconductor laser element and the first and second heatsinks respectively, the heat dissipating characteristics are remarkably improved and the reliability under a high output operation is further increased.

Also, in the case where the semiconductor laser of the invention described above has at least a part of the cooling medium passageway constructed of the groove formed on the substrate of the semiconductor laser element, or of the ridge groove formed on the surface of the semiconductor laser element opposite to the substrate, the structured of the cooling medium passageway becomes simple and can be formed in a small size. Therefore, the structure of the semiconductor laser can be simplified and miniaturized.

In addition, when the groove wall portions of the groove formed in the semiconductor laser element are coated with the dielectric, it prevents problems such as short-circuiting, etc., which may be caused by the direct contact of the cooling medium with the portion conducting an electric current of the semiconductor laser element.

Furthermore, in the case where the semiconductor laser of the invention described above has the supply passageway for supplying the cooling medium to the cooling medium passageway by connecting thereto and/or the discharge passageway for discharging the cooling medium from the cooling medium passageway is formed in the heatsink, the structures of the supply passageway and the discharge passageway for the cooling medium can be simplified. Therefore, the structure of the semiconductor laser can be simplified and miniaturized.

In addition, when the heatsink is bonded to the semiconductor laser element using a brazing material having a resistance to the cooling medium, the occurrence of the problem that the brazing material is deteriorated by the cooling medium to weaken the bonding between the heatsink and the semiconductor laser element can be prevented.

Further, in the case where the semiconductor laser of the invention described above has a plurality of semiconductor laser elements constituting a semiconductor laser array and where the cooling medium passageway connects each of the semiconductor laser elements and the heatsink, each of the semiconductor laser elements can be efficiently cooled and the reliability of the semiconductor laser array under high-output operation can be increased.

Also, the semiconductor laser element according to another aspect of the invention is a semiconductor laser element comprising a GaN substrate provided with one of a pair of electrodes, a semiconductor layer which is made of a GaN-base semiconductor containing at least an active layer and which is disposed on the GaN substrate, the other of the pair of electrodes disposed on the semiconductor layer, and an electric current injection region for injecting an electric current onto the semiconductor layer, wherein a groove is formed on a region of the GaN substrate corresponding to the electric current injection region to a depth reaching the semiconductor layer from the surface of the substrate opposite to the side of the semiconductor layer, and wherein one of the electrodes is formed on the surface of the groove.

In this case, it is desirable that a contact layer is formed on the GaN substrate side of the semiconductor layer, and the contact layer is ohmic-connected to one of the electrodes formed on the surface of the groove.

Also, it is desired that the surface of the groove filled with a metal having a higher heat conductivity than GaN is flattened and a heatsink is bonded to the flattened surface. It is preferred that the metal is Au.

Also, the semiconductor laser device according to another aspect of the invention comprises the semiconductor laser element of the present invention according to the above-described construction, a heatsink which is connected to the GaN substrate side of the semiconductor laser element and which has a supply passageway for supplying a cooling medium to a groove and a discharge passageway for discharging the cooling medium from the groove, and means for transferring a cooling medium through the groove via both the passageways.

In addition, the groove may be formed along an entire length from one end face vertical to the resonance direction of light to the other end face, or may be a part between one end face and the other end face.

Also, the above-described one of the electrodes may be formed so as to not only the inside surface of the groove but also the area between the inside of the groove and the surface opposite to the surface laminated with the semiconductor layer of the GaN substrate.

In addition, the above-described GaN-base semiconductor a semiconductor including Ga and N as the constituent features, for example, GaN, InGaN or AlGaN.

According to the semiconductor laser element of the invention described above, where a groove is formed at the region of the GaN substrate corresponding to the electric current injection region to a depth reaching the semiconductor layer and where one of the electrodes is formed on the surface of the groove, the construction thereof includes a pair of electrodes formed at both end faces in of the laminated layer direction making the passage for the electric current straight. Thus, the electric current is uniformly injected onto the active layer, whereby a uniform oscillation mode with the optical density of a Gauss-type distribution can be obtained. Therefore, unlike in the prior art, the output can be increased without narrowing the ridge width for making the optical density uniform. Thus, it is possible to increase the output and to obtain the oscillation beam having a high quality and a high reliability.

In addition, because the side surface of the semiconductor laser element was etched to the n-GaN layer and an n-electrode was formed thereon in the semiconductor laser element using the GaN substrate of prior art, the form of the semiconductor laser element was complicated. Thus, the p-electrode side near the active layer could not connect (p-down bonding) to the heatsink, and cooling was carried out from the n-electrode side. However, according to the semiconductor laser element of the invention, it becomes possible to connect the p-electrode side near the active layer to the heatsink, the cooling effect is increased, and the oscillation mode of a high quality can be obtained even under high output operation. Alternatively, it becomes possible to connect the n-electrode side to the heatsink (n-down bonding). Furthermore, it is possible to connect both the electrodes to the heatsink, whereby the cooling effect is further increased and the oscillation mode of a high quality can be obtained even under high output operation.

Also, as the contact layer is formed on the GaN substrate side of the semiconductor layer and as the contact layer and one of the electrodes formed on the surface of the groove forms an ohmic-connection, the resistance of the semiconductor laser element can be reduced. Thus, the influence of the heat generation is restrained and the beam of a high quality can be obtained.

Also, because the groove is filled with a metal having a higher heat conductivity than GaN, the surface of the side having the groove is flattened, and the heatsink is connected to the flattened surface, the semiconductor laser element is uniformly connected to the heatsink. Therefore, the heat dissipating characteristics are improved to restrain the influence of the heat generation. Also, good heat dissipation can be obtained because the metal filled in the groove is Au.

Furthermore, the heat can be more efficiently dissipated and the oscillation mode of a high quality can be obtained even under high output operation, according to the semiconductor laser of the invention described above comprising the semiconductor laser element of the invention having the above-described construction, the heatsink connected to the substrate side of the semiconductor laser element, and a supply passageway for supplying a cooling medium to the groove, a discharge passageway for discharging the cooling medium from the groove, and means for causing the cooling medium to flow to the groove through both the passageways.

BRIEF DESCRIPTION OF THE DRAWINGS

FIG. 7 is a cross-sectional view of the semiconductor laser array of FIG. 5, FIG. 8 is a view showing the light-emitting face of the semiconductor laser element of the third embodiment of the invention, FIG. 14 is a cross-sectional view of the semiconductor laser of the fifth embodiment of the invention, FIG. 15 is a view showing the light-emitting face of the semiconductor laser element constituting the semiconductor laser of FIG. 14, FIG. 16 is a cross-sectional view of the semiconductor laser of FIG. 15, FIG. 17 is a graph showing the driving electric current to light output characteristics of the semiconductor laser of FIG. 14, and the corresponding characteristics of the apparatus of prior art.

DETAILED DESCRIPTION OF THE INVENTION

Figure 1:
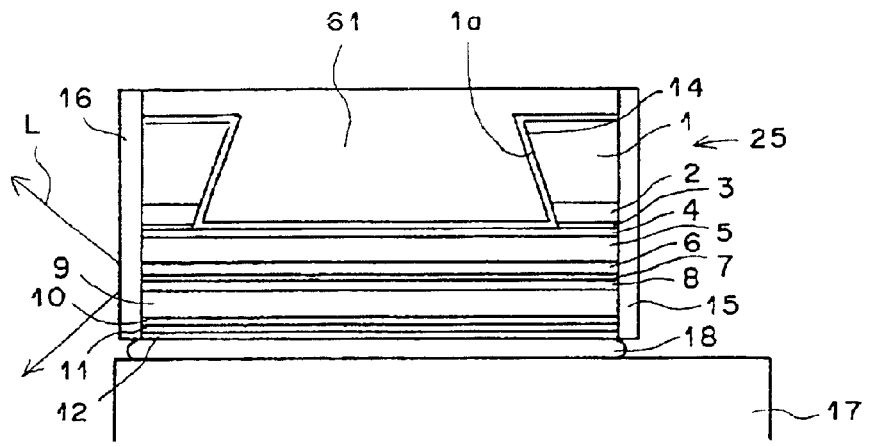
FIG. 1 is a view showing the semiconductor laser element according to the first embodiment of the invention in use.

Specific embodiments of the present invention will be described in detail by referring to the accompanying drawings. FIG. 1 shows a cross-sectional view of the semiconductor laser element according to the first embodiment of the invention. Also, FIG. 2 shows the light-emitting face of the semiconductor laser element 25, which is the form of the end face becoming a resonator face, and FIG. 3 shows the cross-sectional form (state during the preparation) taken along the line A—A of FIG. 2.

Figure 2:
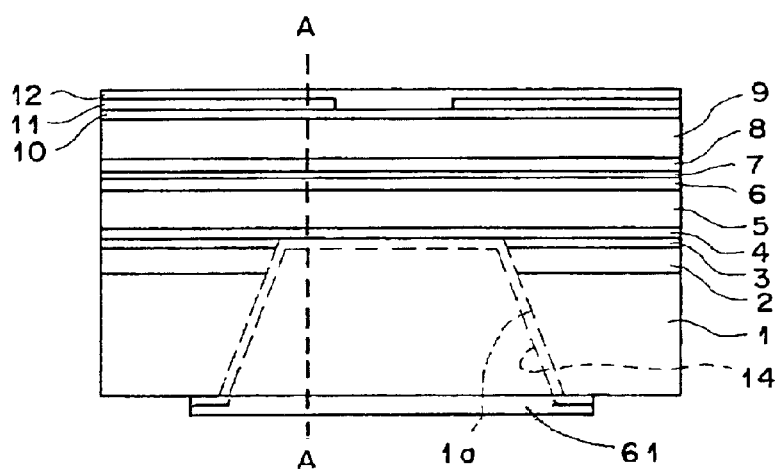
FIG. 2 is a view showing the light-emitting face of the semiconductor laser element of FIG. 1.
Figure 3:
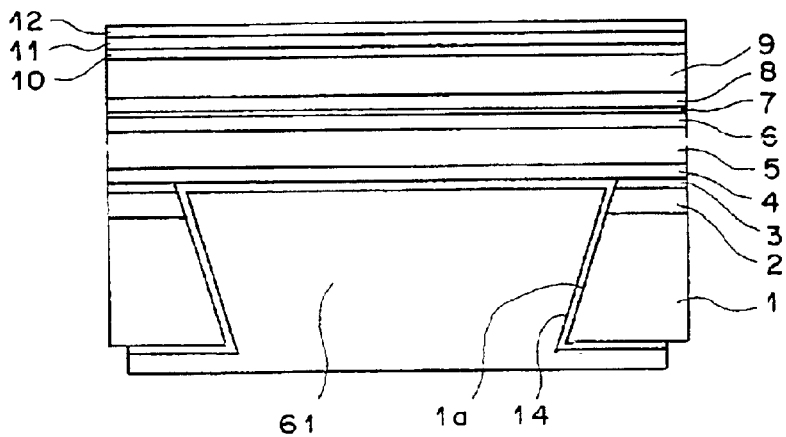
FIG. 3 is a cross-sectional view of the semiconductor laser element of FIG. 2.

First, by referring to FIG. 2 and FIG. 3, the construction of the semiconductor laser element 25 is explained together with the preparation method thereof. Successively grown using an organometallic vapor-phase growing method on a (100) n-GaAs substrate 1 are an n-GaAs buffer layer 2, an n-In$_{0.49}$Ga$_{0.51}$P etching preventing layer 3, an n-GaAs contact layer 4, an n-Ga$_{1-z1}$Al$_{z1}$As lower clad layer 5 (0.55≦z1≦0.8), an n- or i-In$_{0.49}$Ga$_{0.51}$P lower optical waveguide layer 6, an In$_{x3}$Ga$_{1-x3}$As$_{1-y3}$P$_{y3}$ quantum well active layer 7 (0≦x3≦0.3, 0≦y3≦0.6), a p- or i-In$_{0.49}$Ga$_{0.51}$P upper optical waveguide layer 8, a p-Ga$_{1-z1}$Al$_{z1}$As upper clad layer 9, and a p-GaAs contact layer 10. Then, an insulating film 11 is formed thereon, with a stripe direction being parallel to the orientation flat direction $<0\overline{1}\overline{1}>$ The insulating film 11 is removed in a stripe form having a width of about 200 µm by an ordinary lithographic method. Then, a p-side electrode 12 is formed thereon.

Then, the n-GaAs substrate 1 is abraded to be made thin. Formed on the back surface thereof is an insulating film (not shown). Then, an SiO$_2$ pattern (not shown) having a stripe-form opening is formed by a lithographic method using the insulating film as a mask, with the lengthwise direction of the groove defined parallel to the (100) plane. Using the SiO$_2$ pattern as a mask, the substrate 1 is etched with a sulfuric acid-base or ammonia-base etchant to form a reverse mesa-form groove (concaved portion) 1a. In this case, the etching is automatically stopped at the n-In$_{0.49}$Ga$_{0.51}$P etching-preventing layer 3 and GaAs is etched down to the etching-preventing layer 3.

Then, the n-In$_{0.49}$Ga$_{0.51}$P etching-preventing layer 3 is removed with a hydrochloric acid-base etching solution. Also, after removing the above-described insulating film, an n-side electrode 14 is formed. After a solvent containing an Au material is deposited thereon by a spin coating method, annealing is carried out at about 400° C. for 30 minutes to form an Au layer 61 in the form of flatly filling the groove 1a. In addition, as the coating method of the solvent containing the Au material described above, the method shown, for example, in Japanese Unexamined Patent Publn. No. 10(1998)-22574 can be suitably used.

Thereafter, the semiconductor laser element 25 shown in FIG. 1 is obtained when the n-side electrode 14 and the Au layer 61 of a sample cleavage region are removed by a photolitho-etching method to form a high-reflectance coat 15 and a low-reflectance coat 16 on the resonator faces the faces formed by cleaving the sample at the designated positions for both faces.

The semiconductor laser element 25 is constituted of the n-GaAs substrate 1, the n-GaAs buffer layer 2, the n-In$_{0.49}$Ga$_{0.51}$P etching-preventing layer 3, the n-GaAs contact layer 4, the n-Ga$_{1-z1}$Al$_{z1}$As lower clad layer 5 (0.55≦z1≦0.8), the n- or i-In$_{0.49}$Ga$_{0.51}$P lower optical waveguide layer 6, the In$_{x3}$Ga$_{1-x3}$As$_{1-y3}$P$_{y3}$ quantum well active layer 7 (0≦x3≦0.3, 0≦y3≦0.6), the p- or i-In$_{0.49}$Ga$_{0.51}$P upper optical waveguide layer 8, the p-Ga$_{1-z1}$Al$_{z1}$As upper clad layer 9, the p-GaAs contact layer 10, the insulating film 11, the p-side electrode 12, the n-side electrode 14, the Au layer 61, the high-reflectance coat 15, and the low-reflectance coat 16.

The semiconductor laser element 25 is used in the state having the p-side bonded to a copper-made heatsink 17 with an In brazing material 18. Laser light L emitted from the end face applied with the above-described low-reflectance coat 16. In addition, the active layer may be any type of a compression set, a lattice matching, and a tensile strain quantum well.

In the semiconductor laser element 25, the heat dissipation is made as usual via the heatsink 17. In addition to that, because the groove 1a formed in the n-GaAs substrate 1 is filled with the Au layer 61 having a higher heat conductivity than the substrate 1, the heat generated at the quantum well active layer 7 and the vicinity thereof is more efficiently dissipated though the Au layer than through the substrate 1 only. Thus, the temperature of the semiconductor laser element 25 (more practically, the temperature in the vicinity of the quantum well active layer 7) is kept low, and a high reliability is insured even under high-output operation. Herein, the heat conductivity of the n-GaAs substrate 1 is about 50 W/(m●K), while the heat conductivity of the Au layer 61 is about 3000 W(m●K).

Figure 4:
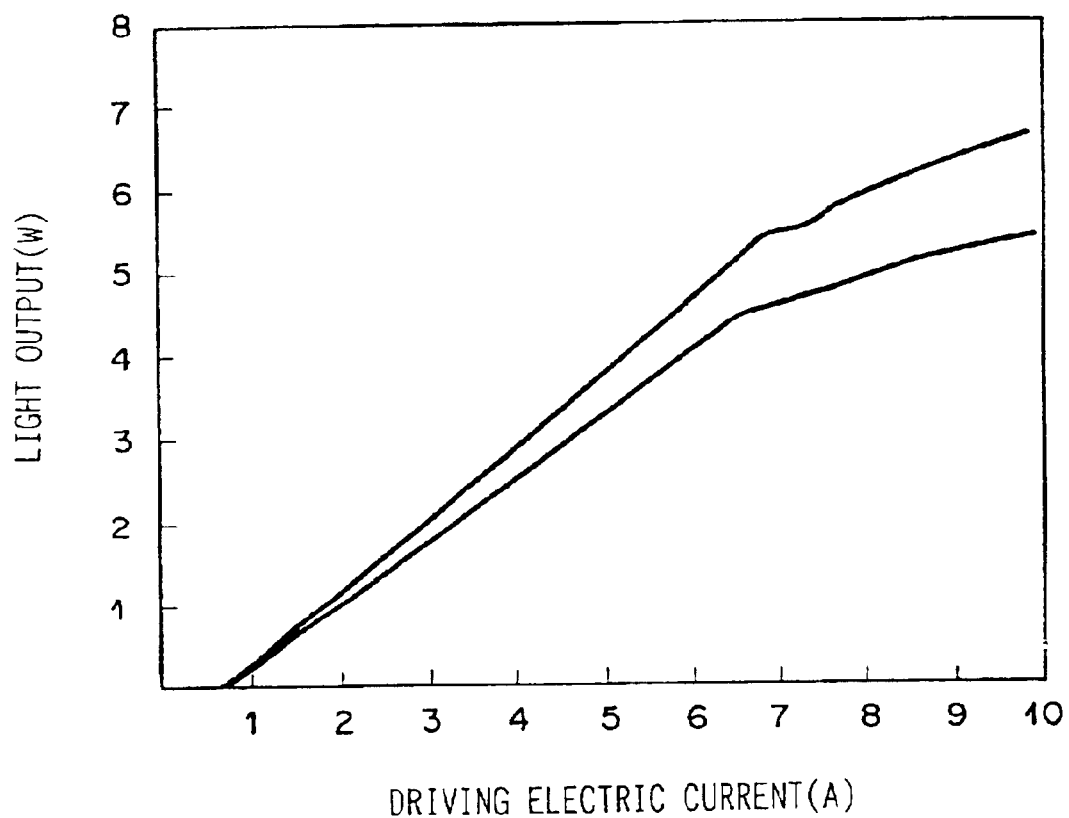
FIG. 4 is a graph showing the driving electric current to light output characteristics of the semiconductor laser element of FIG. 1, and the corresponding characteristics of the device of the prior art.

FIG. 4 shows the electric current to light output characteristics of the semiconductor laser element 25 of the embodiment, together with the corresponding characteristics of a semiconductor laser element of the prior art. The semiconductor laser element of the prior art has almost the same layer construction as that of the semiconductor laser element 25 of the embodiment of the invention, except that it is not equipped with the above-described Au layer 61. The p-side thereof is connected to the copper-made heatsink same as that in FIG. 1 by an In brazing material. Also, in both the semiconductor laser elements, the heatsink bonded to the p-side is further connected to an electronic cooling element and the temperature of the heatsink is fixed at 25° C.

As shown in FIG. 4, in the semiconductor laser element 25 of the invention, the slope efficiency is improved in the high-driving electric current side (that is, a high light output side), and the maximum light output is improved by about 1.5 W compared to the semiconductor laser element of prior art. Also, the semiconductor laser element of the invention has the effect of restraining the generation of a kink even in the range of a high light output.

In addition, although the present invention is applied to a gain waveguide stripe laser having an insulating film stripe in the above-described embodiment of the invention, the invention is not limited to this embodiment but can be similarly applied to a semiconductor laser equipped with a refractive index waveguide mechanism, a semiconductor laser equipped with a diffraction grating, and a light integrated circuit having a semiconductor laser element.

Also, the clad layer may be an InGaAlP-system or an InGsAlAsP-system lattice-matching to the GaAs substrate 1. Also, although the n-type conductive substrate is used as the GaAs substrate 1 in the above-described embodiment, a p-type conductive substrate may instead be used. In this case, all the conductivity types in the above description will be reversed.

Furthermore, although the groove 1a formed in the substrate 1 is formed in an almost rectangular parallelepiped form if the slanting form of the sidewalls is disregarded in the above-described embodiment, other groove forms may be employed as far as similar effects can be obtained. Also, because the groove $1a$ formed by etching with a sulfuric acid-base etching solution is in a reverse mesa form when viewed from the end face of the semiconductor laser element and extends beyond the etching mask to the light-emitting facet side, the groove $1a$ works effectively in cooling the light-emitting face by locating the Au layer 61 closer the light-emitting face.

Figure 5:
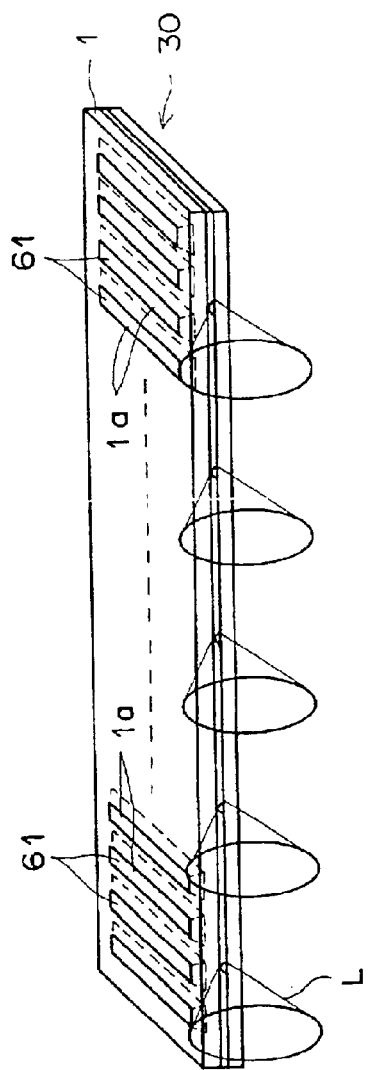
FIG. 5 is a perspective view of the semiconductor laser element of the second embodiment of the invention.
Figure 6:
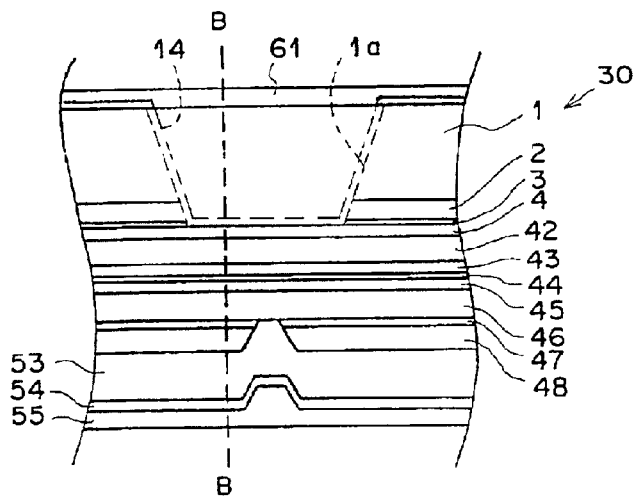
FIG. 6 is a view showing the light-emitting face of the semiconductor laser array of FIG. 5.

The second embodiment of the invention will now be explained. FIG. 5 shows the perspective view of the semiconductor laser element 30 according to the second embodiment of the invention, FIG. 6 shows the form of the light-emission side face (the end face working as a resonator face) of one light-emitting portion of the semiconductor laser array 30. FIG. 7 shows the form of the cross-section taken along the line B—B of FIG. 6. In addition, in FIG. 5 and the figures thereafter, elements that are identical to elements in FIGS. 1 to 4 have the identical numbers and, if unnecessary, the explanations of them are omitted.

First, by referring to FIG. 6 and FIG. 7, the construction of the semiconductor laser array 30 and the preparation method thereof are explained. On a (100) n-GaAs substrate 1 there are successively grown an n-GaAs-buffer layer 2, an n-In$_{0.49}$Ga$_{0.51}$P etching-preventing layer 3, an n-GaAs contact layer 4, an n-In$_{0.5}$(Ga$_{1-z2}$Al$_{z2}$)$_{0.5}$P lower clad layer ($0.2 \leq z2 \leq 1$) 42, an n- or i-In$_{0.49}$Ga$_{0.51}$P lower optical waveguide layer 43, an In$_{x3}$Ga$_{1-x3}$As$_{1-y3}$P$_{y3}$ quantum well active layer 44 ($0 \leq x3 \leq 0.3$, $0 \leq y3 \leq 0.6$), a p- or i-In$_{0.49}$Ga$_{0.51}$P upper optical waveguide layer 45, a p-In$_{0.5}$(Ga$_{1-z2}$Al$_{z2}$)$_{0.5}$P upper clad layer 46, a p-In$_{x4}$Ga$_{1-x4}$As$_{1-y4}$P$_{y4}$ etching-preventing layer ($0 \leq x4 \leq 0.3$, $0 \leq y4 \leq 0.6$) 47, an n-In$_{0.5}$(Ga$_{1-z3}$Al$_{z3}$)$_{0.5}$P current constricting layer ($0.1 \leq z3 \leq z2$) 48, and an n-GaAs cap layer (not shown) by an organometallic vapor phase growing method.

Thereafter, after applying a resist (not shown) onto the above-described GaAs cap layer, the stripe-form resist region having a width of about 3 μm in the vertical direction to the cleaved face of the laser is removed in a direction parallel to the substrate orientation flat direction <0$\overline{1}\overline{1}$>, by an ordinary lithographic method. Thus, using the resist having the stripe-form opening as a mask form together with a tartaric acid etchant, the above-described GaAs cap layer is removed in a stripe.

Then, after peeling off the resist, using the GaAs cap layer as a mask, the n-In$_{0.5}$(Ga$_{1-z3}$Al$_{z3}$)$_{0.5}$P current constricting layer 48 is etched with a hydrochloric acid-base etchant. Further, the p-In$_{x4}$Ga$_{1-x4}$As$_{1-y4}$P$_{y4}$ etching-preventing layer 47 and the above-described n-GaAs cap layer are removed with a sulfuric acid-base etchant.

A p-In$_{0.5}$(Ga$_{1-z1}$Al$_{z1}$)$_{0.5}$P upper clad layer 53 and a p-GaAs contact layer 54 are also grown thereon. The thickness of the upper clad layer 53 is such a thickness that the refractive index waveguide by a single fundamental mode can be maintained up to high output in a waveguide passageway in the groove of the center portion of the resonator. Then, a p-side electrode 55 is formed and thereafter, the substrate 1 is abraded and an insulating film (not shown) having plural stripe-form openings is formed on the substrate side. Also, using the insulating film as a mask, the GaAs substrate 1 is etched in stripe forms by an ECR dry etching using a Cl$_2$ gas to form plural grooves $1a$. In this case, the etching is automatically stopped at the n-In$_{0.49}$Ga$_{0.51}$P etching-preventing layer 3.

Then, the n-In$_{0.49}$Ga$_{0.51}$P etching-preventing layer 3 is removed with a hydrochloric acid-base etching solution.

After removing the above-described insulating film, an n-side electrode 14 is formed thereon. When a solvent containing an Au material is applied thereon by a spin coating method and annealing is carried out at about 400° C. for 30 minutes, an Au layer 61 is formed in the form of flatly filling the groove $1a$.

Thereafter, the n-side electrode 14 and the Au layer 61 at the cleavage region of the sample are removed by a photolithographic etching method. Manufacturing process of the semiconductor laser array 30 is ended by forming a high-reflectance coat 57 and a low-reflectance coat 58 at the surfaces of the resonator of the laser array bar formed by cleaving the sample at the designated positions for both the end faces.

As shown in FIG. 7, the semiconductor laser array 30 is constituted of the n-GaAs substrate 1, the n-GaAs-buffer layer 2, the n-In$_{0.49}$Ga$_{0.51}$P etching-preventing layer 3, the n-GaAs contact layer 4, the n-In$_{0.5}$(Ga$_{1-z2}$Al$_{z2}$)$_{0.5}$P lower clad layer ($0.2 \leq z2 \leq 1$) 42, then- or i-In$_{0.49}$Ga$_{0.51}$P lower optical waveguide layer 43, the In$_{x3}$Ga$_{1-x3}$As$_{1-y3}$P$_{y3}$ quantum well active layer 44 ($0 \leq x3 \leq 0.3$, $0 \leq y3 \leq 0.6$), the p- or i-In$_{0.49}$Ga$_{0.51}$P upper optical waveguide layer 45, the p-In$_{0.5}$(Ga$_{1-z2}$Al$_{z2}$)$_{0.5}$P upper clad layer 46, the p-In$_{x4}$Ga$_{1-x4}$As$_{1-y4}$P$_{y4}$ etching-preventing layer ($0 \leq x4 \leq 0.3$, $0 \leq y4 \leq 0.6$) 47, the n-In$_{0.5}$(Ga$_{1-z3}$Al$_{z3}$)$_{0.5}$P current constricting layer ($0.1 \leq z3 \leq z2$) 48, the p-In$_{0.5}$(Ga$_{1-z1}$Al$_{z1}$)$_{0.5}$P upper clad layer 53, the p-GaAs contact layer 54, the p-side electrode 55, the n-side electrode 14, the Au layer 61, the high-reflectance coat 57, and the low-reflectance coat 58.

As shown in FIG. 5, the semiconductor laser array 30 has a plurality of light-emitting portions arranged in the lengthwise direction of the array with a predetermined interval between each other. Laser light L is emitted by each light-emitting portion. In addition, although omitted in FIG. 5, the semiconductor laser array 30 may be used by connecting each of the p-side and the n-side to a heatsink having a size corresponding to the array bar size using a brazing material to improve the heat dissipation effect.

In the semiconductor laser array 30, the Au layer 61 having a higher heat conductivity than the n-GaAs substrate 1 is filled in the groove $1a$ formed in the substrate 1. Thus, the heat generated at the quantum well active layer 44 and the vicinity thereof is more efficiently dissipated through the Au layer 61 than in the case of being dissipated only though the substrate 1.

Thus, temperature rising of the semiconductor laser array 30 (more practically, the vicinity of the quantum well active layer 44) is restrained to insure high reliability even under high output operation while keeping the single transverse mode. In addition, though the same effect is obtained whether or not the above-described heatsink is connected to the Au layer 61, it is preferred that the heatsink is connected for obtaining a better heat dissipation effect.

Although the invention is applied to the fundamental transverse mode oscillating semiconductor laser in the above-described embodiment, the invention can instead be applied to the semiconductor laser having a wide stripe of at least 3 μm. Also, although the GaAs substrate 1 is an n-type substrate in the above-described embodiment, a p-type conductive substrate may instead be used. In the latter case, all the conductivity types described above may be reversed. Also, the oscillating wavelength band can be controlled within the range of from 700 nm to 1200 nm by the composition of the In$_x$Ga$_{1-x}$As$_{1-y}$P$_y$ quantum well active layer. Also, by using an InGaAlP-base clad layer and an InGaAlP-base optical waveguide layer in which the band gap is smaller than the clad layer, the oscillation within the range of 600 nm to 700 nm becomes possible.

Furthermore, the crystal growing method may be a molecular beam epitaxial growing method using a solid or a gas as the raw material.

Also, the form of the groove formed in the semiconductor laser array is not limited to a rectangle or a comb shape, and other forms may be employed as far as the similar effects are obtained.

Figure 9:
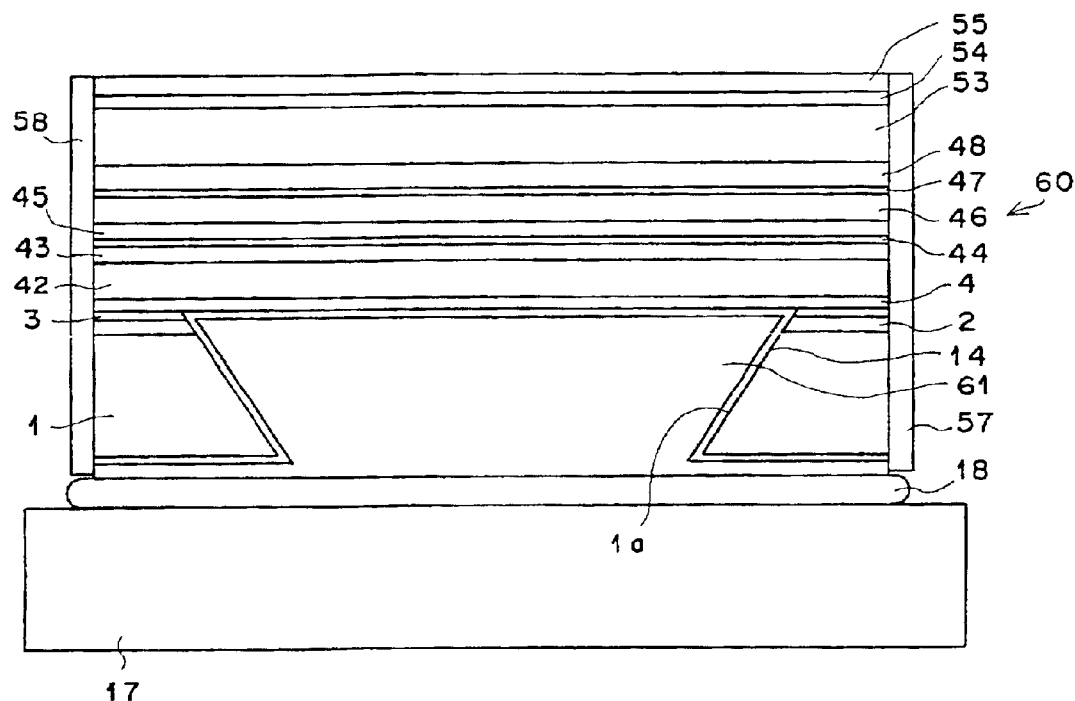
FIG. 9 is a cross-sectional view of the semiconductor laser element of FIG. 8.

The third embodiment of the invention will now be explained. FIG. 8 shows the form of the light-emitting face (the end face becoming a resonator face) of the semiconductor laser element 60 according to the third embodiment of the invention. FIG. 9 shows the shape of the cross-section taken along the line D—D of FIG. 8.

The semiconductor laser element 60 of the third embodiment is formed as a single element, but the layer structure is the same as the semiconductor laser array 30 of the second embodiment of the invention described above. Therefore, layers, etc. in FIGS. 8 and 9 are identified with the same numbers (or numerals) as those of FIGS. 6 and 7, and explanations for them are omitted.

The semiconductor laser element 60 uses a mounting method known as connected surface up, wherein the n-side, that is a substrate 1 side, is connected to a heatsink 17 using an In brazing material 18. In addition, in this case, an Au layer 61 is directly connected to the heatsink 17 via the In brazing material 18. In the construction, because a groove 1$a$ formed in the n-GaAs substrate 1 is filled with the Au layer 61 having a higher heat conductivity than that of the substrate 1, the heat generated at a quantum well active layer 44 and the vicinity thereof is more efficiently conducted to the heatsink 17 through the Au layer 61 than in the case of being conducted through the substrate 1 only. Accordingly, the heat dissipation effect is improved.

Thus, the temperature rising of the semiconductor laser element 60 (more practically, the temperature in the vicinity of the quantum well active layer 44) is restrained, a high reliability is insured even under a high output operation while keeping the single transverse mode.

In addition, in the case of using a ridge-type semiconductor laser element, the ridge groove can be utilized as the cooling medium passageway similar to the groove of the substrate side as described above. In such a case, it becomes possible to effectively cool both the p and n surfaces of the semiconductor laser element. The fourth embodiment of the invention constructed as described above will now be explained.

Figure 10:
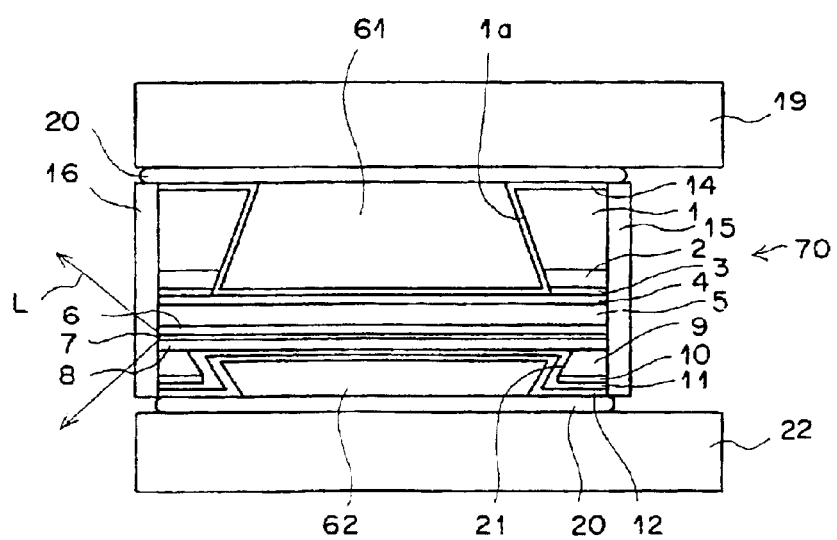
FIG. 10 is a view showing the fourth embodiment of the invention during operation thereof.
Figure 11:
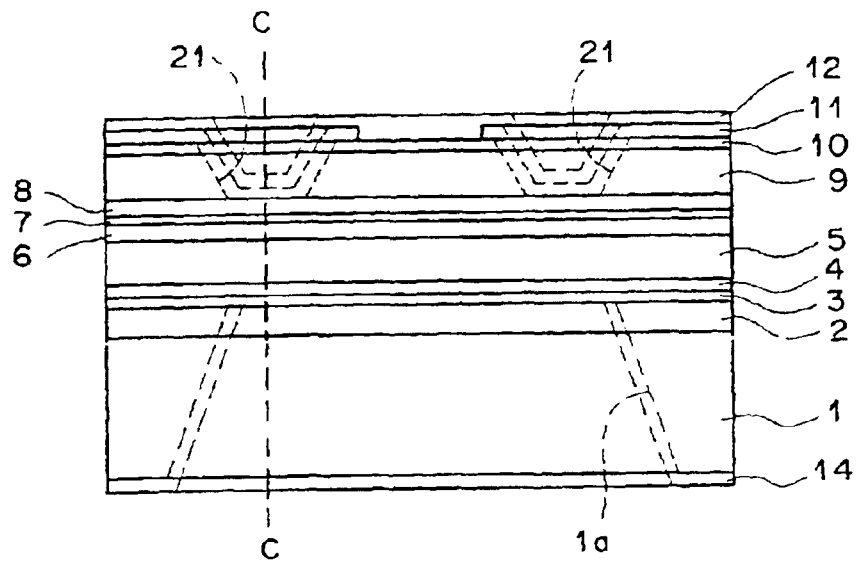
FIG. 11 is a view showing the light-emitting face side of the semiconductor laser element of FIG. 10.
Figure 12:
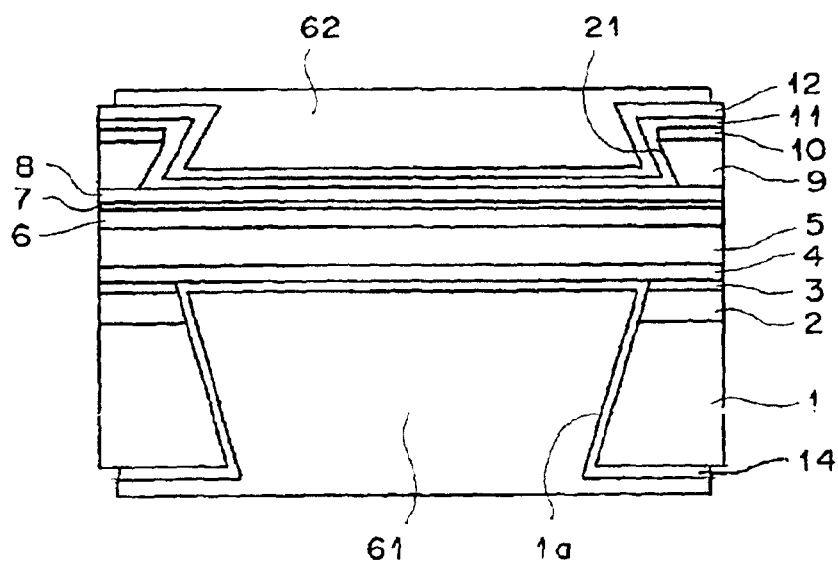
FIG. 12 is a cross-sectional view of the semiconductor laser element of FIG. 10.

FIG. 10 shows the semiconductor laser element 70 according to the fourth embodiment of the invention during operation thereof. Also, FIG. 11 shows the form of the light-emitting face of the semiconductor laser element 70, that is, the end face becoming the resonator face. FIG. 12 shows the cross-sectional shape (the state during the preparation) taken along the line C—C of FIG. 12.

First, by referring to FIGS. 11 and 12, the structure of the semiconductor laser element 70 is explained together with the preparation method thereof. On a (100) n-GaAs substrate 1 there are successively grown an n-GaAs buffer layer 2, an n-In$_{0.49}$Ga$_{0.51}$P etching preventing layer 3, an n-GaAs contact layer 4, an n-Ga$_{1-z1}$Al$_{z1}$As lower clad layer 5 ($0.55 \leq z1 \leq 0.8$), an n- or i-In$_{0.49}$Ga$_{0.51}$P lower optical waveguide layer 6, an In$_{x3}$Ga$_{1-x3}$As$_{1-y3}$P$_{y3}$ quantum well active layer 7 ($0 \leq x3 \leq 0.3$, $0 \leq y3 \leq 0.6$), a p- or i-In$_{0.49}$Ga$_{0.51}$P upper optical waveguide layer 8, a p-Ga$_{1-z1}$Al$_{z1}$As upper clad layer 9, and a p-GaAs contact layer 10, by an organometallic vapor-phase growing method.

Thereafter, two ridge grooves 21 extending in the lengthwise direction of the resonator are formed on the p-GaAs contact layer 10 and the upper clad layer 9 by a photolithographic method. These ridge grooves 21 are parallel to the substrate orientation flat direction $<0\overline{1}1>$.

For example, the width thereof may be 10 $\mu$m, and the interval between them may be 50 $\mu$m.

After forming an insulating film 11 thereon, the insulating film 11 is removed in a stripe form having a width of about 45 $\mu$m between the two ridge grooves. Then, a p-side electrode 12 is formed thereon. By applying thereon a solvent containing an Au material using a spin coating method and annealing it at about 400° C. for 30 minutes, an Au layer 62 is formed in the form of flatly filling the ridge grooves 21.

Thereafter, parts of the p-side electrode and the Au layer 62 within the sample cleavage region are removed by a photolithographic etching method. The n-GaAs substrate 1 is abraded to be thinned to form an insulating layer (not shown) on the back surface thereof. Then, while keeping a part of the above-described insulating film between the designated positions of both end faces is removed by a lithographic method the lengthwise direction of the grooves parallel to the above-described orientation flat. Then, using the insulating film as a mask, an SiO$_2$ pattern (not shown) having a stripe-form opening is formed. Using the SiO$_2$ as a mask, the substrate 1 is etched with a sulfuric acid-base or ammonia-base etchant to form a reverse mesa-form groove 1$a$. In this case, the etching is automatically stopped at the n-In$_{0.49}$Ga$_{0.51}$P etching-preventing layer 3 and GaAs is etched up to the etching-preventing layer 3.

Then, the n-In$_{0.49}$Ga$_{0.51}$P etching-preventing layer 3 is removed with a hydrochloric acid-base etching solution. Also, after removing the above-described insulating film, an n-side electrode 14 is formed. Then, when a solvent containing an Au material is applied thereon using a spin coating method and annealing is carried out at about 400° C. for 30 minutes, an Au layer 61 is formed by flatly filling the groove 1$a$.

Thereafter, the n-side electrode 14 and the Au layer 61 of a sample cleavage region are removed by a photolithographic etching method. Then, the manufacturing process of the semiconductor laser element 70 shown in FIG. 10 is finished by forming a high-reflectance coat 15 and a low-reflectance coat 16 on the resonator surface formed by cleaving the sample at the positions of establishing both end faces to form a chip.

The semiconductor laser element 70 is constituted of the n-GaAs substrate 1, the n-GaAs buffer layer 2, the n-In$_{0.49}$Ga$_{0.51}$P etching-preventing layer 3, the n-GaAs contact layer 4, the n-Ga$_{1-z1}$Al$_{z1}$As lower clad layer 5 ($0.55 \leq z1 \leq 0.8$), the n- or i-In$_{0.49}$Ga$_{0.51}$P lower optical waveguide layer 6, the In$_{x3}$Ga$_{1-x3}$As$_{1-y3}$P$_{y3}$ quantum well active layer 7 ($0 \leq x3 \leq 0.3$, $0 \leq y3 \leq 0.6$), the p- or i-In$_{0.49}$Ga$_{0.51}$P upper optical waveguide layer 8, the p-Ga$_{1-z1}$Al$_{z1}$As upper clad layer 9, the p-GaAs contact layer 10, the insulating film 11, the p-side electrode 12, the n-side electrode 14, the Au layer 61, the Au layer 62, the high-reflectance coat 15 and the low-reflectance coat 16.

As shown in Table 10, the semiconductor laser element 70 is used in the state where the Au layer 62 of the p-side is connected to the copper-made heatsink 22 via an AuZn brazing material 20 and the Au layer 61 of the n-side is similarly also connected to the copper-made heatsink 19 via the AuZn brazing material 20, and where a laser light L is emitted from the end face having the above-described low-reflectance coat 16. In addition, the active layer may be any of a compression set type, a lattice matching type, and a tensile strain quantum swell type.

Because in the groove 1a formed in the n-GaAs substrate 1 is filled with the Au layer 61 having a higher heat conductivity than that of the substrate 1 in the present embodiment, the heat generated at a quantum well active layer 7 and the vicinity thereof is more efficiently conducted to the heatsink 19 through the Au layer 61 than in the case of being conducted through the substrate 1. Accordingly, the heat dissipation effect is improved.

Furthermore, because the ridge grooves 21, each formed on the p-$Ga_{1-z1}Al_{z1}$As upper clad layer 9 and the p-GaAs contact layer 10, are filled with the Au layer 62 having a higher heat conductivity than those of these layers 9 and 10, the heat generated at a quantum well active layer 7 and the vicinity thereof is still more efficiently conducted to the heatsink 20 through the Au layer 10 than in the case of being conducted through the p-$Ga_{1-z1}Al_{z1}$As upper clad layer 9 and the p-GaAs contact layer 10. Accordingly, the heat dissipating effect is improved. In addition, each of the heat conductivities of the p-$Ga_{1-z1}Al_{z1}$As upper clad layer 9 and the p-GaAs contact layer 10 is about 50 W/(m●K) while the heat conductivity of the Au layer 62 is about 3000 W/(m●K).

Thus, temperature rising of the semiconductor laser element 70 (more practically, the temperature rising in the vicinity of the quantum well active layer 7) is restrained, and a high reliability is insured even under a high-output operation while keeping the single transverse mode.

In addition, the shape each of the heatsinks 19 and 20 is not limited to the rectangular parallelepiped block shape, but other shapes equipped with a feather-like or projection form heat dissipation fan, etc., can be suitably used. This is the same as the heatsinks used in the first embodiment and the third embodiment.

Also, the metal filled in the concaved portions formed on the substrate and the semiconductor layer is not limited to Au used in the embodiments described above, but other metals such as Ag, Al, Cu, etc., having a relatively high heat conductivity on Au added with impurities can be suitably used.

Figure 13:
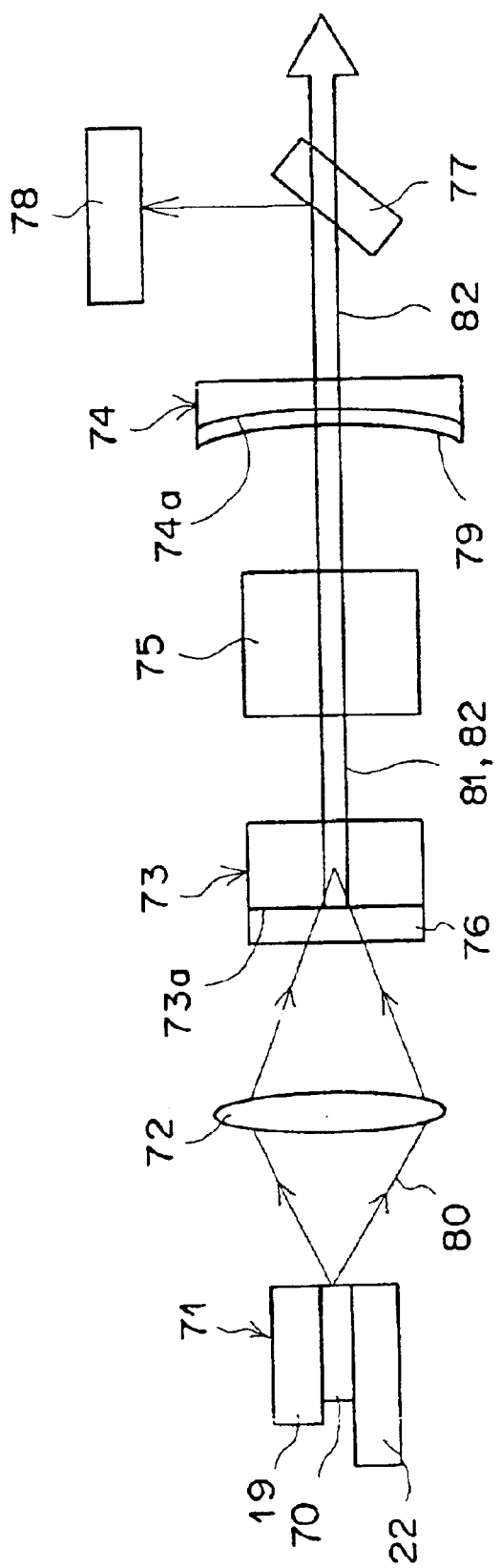
FIG. 13 is a schematic side view of a solid laser apparatus using the semiconductor laser element of the invention.

Referring to FIG. 13, an application example of the semiconductor laser element of the invention will now be explained. The semiconductor laser element 70 used in this case is, for example, the semiconductor laser element of the fourth embodiment shown in FIG. 4, constituting a semiconductor laser together with the heatsinks 19 and 20, and used as the exciting light source of a solid laser apparatus generating secondary higher harmonics.

That is, the solid laser apparatus is comprised of the semiconductor laser 71 having the above-described structure, a collective lens 72 for collecting a laser light 80 which is an excited light emitted from the semiconductor laser element, a solid laser crystal 73 excited by the collected laser light 80, an output mirror 74 consisting of a concave mirror constituting a solid laser resonator together with the solid laser crystal 73, and a nonlinear optical crystal 75 disposed between the solid laser crystal 73 and the output mirror 74.

For example, Nd:$YVO_4$, Nd:YAG, Nd:YLF, etc., are used as the solid laser crystal 73. As the nonlinear optical crystal 75, for example, a $KNbO_3$ crystal, a KTP crystal, a $LiNbO_3$ crystal having a periodic domain inversion structure, etc., are used.

Also, the temperatures of the semiconductor laser 71, the solid laser crystal 73, and the nonlinear optical crystal 75 are adjusted to predetermined temperatures using Partier elements and temperature-controlling circuits (not shown).

Formed on an end face 73a on the excited light incident side of the above-described solid laser crystal 73 is a coat film 76, which transmits the laser light 80 well and reflects a solid laser light 81 and the secondary higher harmonics 82 described below well. On the other hand, formed on a mirror face 74a of the output mirror 74 is a coat film 79, which reflects the above-described laser light 80 and the solid laser light 81 well and transmits some of the secondary harmonics 82.

In the structure described above, the solid laser crystal 73 emits a light excited by the laser light 80. The emitted light resonates between the solid laser crystal face 73a provided with the above-described coat film 76 and the mirror face 74a provided with a coat film 79, whereby the solid laser light 81 is generated. The solid laser light 81 enters the nonlinear optical crystal 75 and is converted into the secondary higher harmonics 82 having a wavelength of ½.

From the output mirror 74, substantially only the secondary higher harmonics 82 are emitted, and only those portions of the secondary higher harmonics 82 transmitting a beam splitter 77 are used for a specific use. Also, the rest portions of the secondary higher harmonics reflected by the beam splitter 77 enter a light-receptive element 78. A light intensity detecting signal output from the light-receptive element 78 enters an APC (automatic power control) circuit (not shown), and the driving electric current of the semiconductor laser element 70 is controlled by the APC circuit so that the light intensity detected by the light-receptive element 78 is kept at a constant level. As a result, the light output of the secondary higher harmonics 82 transmitting the beam splitter 77 is kept at a constant level.

FIG. 14 shows the cross-sectional shape of the semiconductor laser according to the fifth embodiment of the invention. FIG. 15 shows the shape of the light-emitting face of a semiconductor laser element 125 constituting the semiconductor laser, that is, the end face becoming the resonator face. FIG. 16 shows the shape of the cross section (the state during preparation) taken along the line A—A of FIG. 15.

First, referring to FIGS. 15 and 16, the construction of the semiconductor laser element 125 and the preparation method thereof will be explained. On a (100) n-GaAs substrate 101 there are successively grown, an n-GaAs buffer layer 102, an n-$In_{0.49}Ga_{0.51}$P etching-preventing layer 103, an n-GaAs contact layer 104, an n-$Ga_{1-z1}Al_{z1}$As lower clad layer 105 ($0.55 \leq z1 \leq 0.8$), an n- or i-$In_{0.49}Ga_{0.51}$P lower optical waveguide layer 106, an $In_{x3}Ga_{1-x3}As_{1-y3}P_{y3}$ quantum well active layer 107 ($0 \leq x3 \leq 0.3, 0 \leq y3 \leq 0.6$), a p- or i-$In_{0.49}Ga_{0.51}$P upper optical waveguide layer 108, a p-$Ga_{1-z1}Al_{z1}$As upper clad layer 109, and a p-GaAs contact layer 110 by an organometallic vapor-phase growing method.

After an insulating film 111 is formed thereon, the insulating film 111 is removed in a stripe form having a width of about 200 μm by an ordinary lithographic method with the stripe direction parallel to the orientation flat direction. Then, a p-side electrode 112 is formed thereon.

The n-GaAs substrate 101 is abraded to be thinned, and an insulating film (not shown) is formed on the back surface thereof. Then, using the insulating film as a mask, an $SiO_2$ pattern (not shown) having a stripe-form opening is formed by a lithographic method while keeping the lengthwise direction of groove parallel to the (100) face. Using the $SiO_2$ pattern as a mask, the substrate 102 is etched with a sulfuric acid-base or ammonia-base etchant to form a reverse mesa-form groove 101a. In this case, the etching is automatically stopped at the n-$In_{0.49}Ga_{0.51}$P etching-preventing layer 103, and GaAs is etched down to the etching-preventing layer 103.

Then, the n-$In_{0.49}Ga_{0.51}P$ etching-preventing layer 103 is removed with a hydrochloric acid-base etching solution. Also, after removing the above-described insulating film, an n-side electrode 114 is formed. Thereafter, a high-reflectance coat 115 and a low-reflectance coat 116 are formed on the resonator face formed by cleaving the sample at the designated positions of both end faces to form a chip. Accordingly, the semiconductor laser element 125 shown in FIG. 14 is obtained. The semiconductor laser element 125 emits a laser light L from the end face applied with the above-described low-reflectance coat 116. In addition, the active layer may be any of a compression set type, a lattice matching type, and a tensile strain quantum swell type.

As shown in FIG. 14, the semiconductor laser element 125 is comprised of the n-GaAs substrate 101, the n-GaAs buffer layer 102, the n-$In_{0.49}Ga_{0.51}P$ etching-preventing layer 103, the n-GaAs contact layer 104, the n-$Ga_{1-z1}Al_{z1}As$ lower clad layer 103 ($0.55 \leq z1 \leq 0.8$), the n- or i-$In_{0.49}Ga_{0.51}P$ lower optical waveguide layer 106, the $In_{x3}Ga_{1-x3}As_{1-y3}P_{y3}$ quantum well active layer 107 ($0 \leq x3 \leq 0.3$, $0 \leq y3 \leq 0.6$), the p- or i-$In_{0.49}Ga_{0.51}P$ upper optical waveguide layer 108, the p-$Ga_{1-z1}Al_{z1}As$ upper clad layer 109, the p-GaAs contact layer 110, the insulating film 111, the p-side electrode 112, the n-side electrode 114, the high-reflectance coat 115, and the low-reflectance coat 116.

Also, as shown in the same figure, the semiconductor laser of the embodiment is comprised of the above-described semiconductor laser element 125, a copper-made heatsink 117 bonded to the p-side of the semiconductor laser element 125 by an In brazing material 118, a copper-made heatsink 119 bonded to the n-side (that is, the substrate 101) by an AuSn brazing material 120, insulating tubes 126a and 126b connected to a cooling medium supply passageway 119a and a cooling medium discharge passageway 119b respectively passing through the heatsink 119, and a circulator 127 connected to these insulating tubes 126a and 126b.

In the semiconductor laser, a reverse mesa-form groove 101a formed in the substrate 101 is closed by the heatsink 119, and the groove 101a constitutes a cooling medium passageway having the substrate 101 and the heatsink 119 as the passageway walls. A cooling medium 128 circulated by the above-described circulator 127 flows through the cooling medium passageway, and the semiconductor laser element 125 is cooled by the cooling medium 128. An arrow R in FIG. 14 shows the general flowing direction of the cooling medium 128. For example, water or a similar liquid can be suitably utilized as the cooling medium.

In the above structure, the cooling medium 128 flows in direct contact with the semiconductor laser element 125 and the heatsink 119. Thus, the heat dissipation from the semiconductor laser element 125 to the heatsink 119 is made sufficiently effectively via the cooling medium 128, and the temperature rising of the semiconductor laser element 125 (more practically, the temperature rising in the vicinity of the quantum well active layer 107) is restrained to insure a high reliability even under a high-output operation.

FIG. 17 shows the electric current to light output characteristics of the semiconductor laser according to the embodiment of the invention, and the corresponding characteristics of a semiconductor laser of the prior art. The device of the prior art uses a semiconductor laser element having the same layer configuration as those of the semiconductor laser element 125 in the embodiment but not having the reverse mesa-form groove 101a described above. The p-side of the element is connected to a copper-made heatsink using an In brazing. In addition, in both the semiconductor lasers, the heatsink connected to the p-side is further connected to an electronic cooling element to fix the temperature of the heatsink at 25° C.

As shown in FIG. 17, in the semiconductor laser of the invention, the slope efficiency at the high-driving electric current side (that is, a high light output side) is improved, and the maximum light output is also improved by about 3 W compared with the semiconductor laser of the prior art.

Although the invention is applied to a gain waveguide stripe laser forming the insulating film stripe in the above-described embodiment, the invention can be similarly applied to a semiconductor laser equipped with a refractive index waveguide mechanism, a semiconductor laser equipped with a diffraction grating, and a light integrated circuit having a semiconductor laser element.

Also, the clad layer may be an InGaAlP-system or an InGsAlAsP-system lattice-matching type to the GaAs substrate 101. In addition, although the n-type conductive substrate is used as the GaAs substrate 101 in the above embodiment, a p-type conductive substrate may instead be used. In the latter case, all the conductivity types may be reversed to the above descriptions.

Furthermore, although the groove 101a on the substrate 101 is formed in an almost rectangular parallelepiped form if the slanting form of the sidewalls is disregarded in the above-described embodiment, other groove forms may be employed as long as similar effects are obtained. Also, because the groove 101a formed by etching with a sulfuric acid-base etching solution is in a reverse mesa form when viewed from the end face of the semiconductor laser element and extends beyond the etching mask toward the light-emitting face, it is more effective is cooling the light-emitting face.

Also, an AuSn brazing material 120 free from a problem of being deteriorated with water is used as a brazing material for connecting the substrate 101 on which the groove is formed to the heatsink 119 in the above embodiment of the invention, other brazing materials may instead be used as long as the material has a resistance to the cooling medium. In addition, the In brazing material has a possibility of being deteriorated with water.

Also, it is more effective for restraining the COD by the heat generation of the light-emitting face to locate the cooling medium supply passageway 119a for introducing a cooling medium formed in the heatsink 119 as close as possible to the light-emitting face of the semiconductor laser element.

Figure 18:
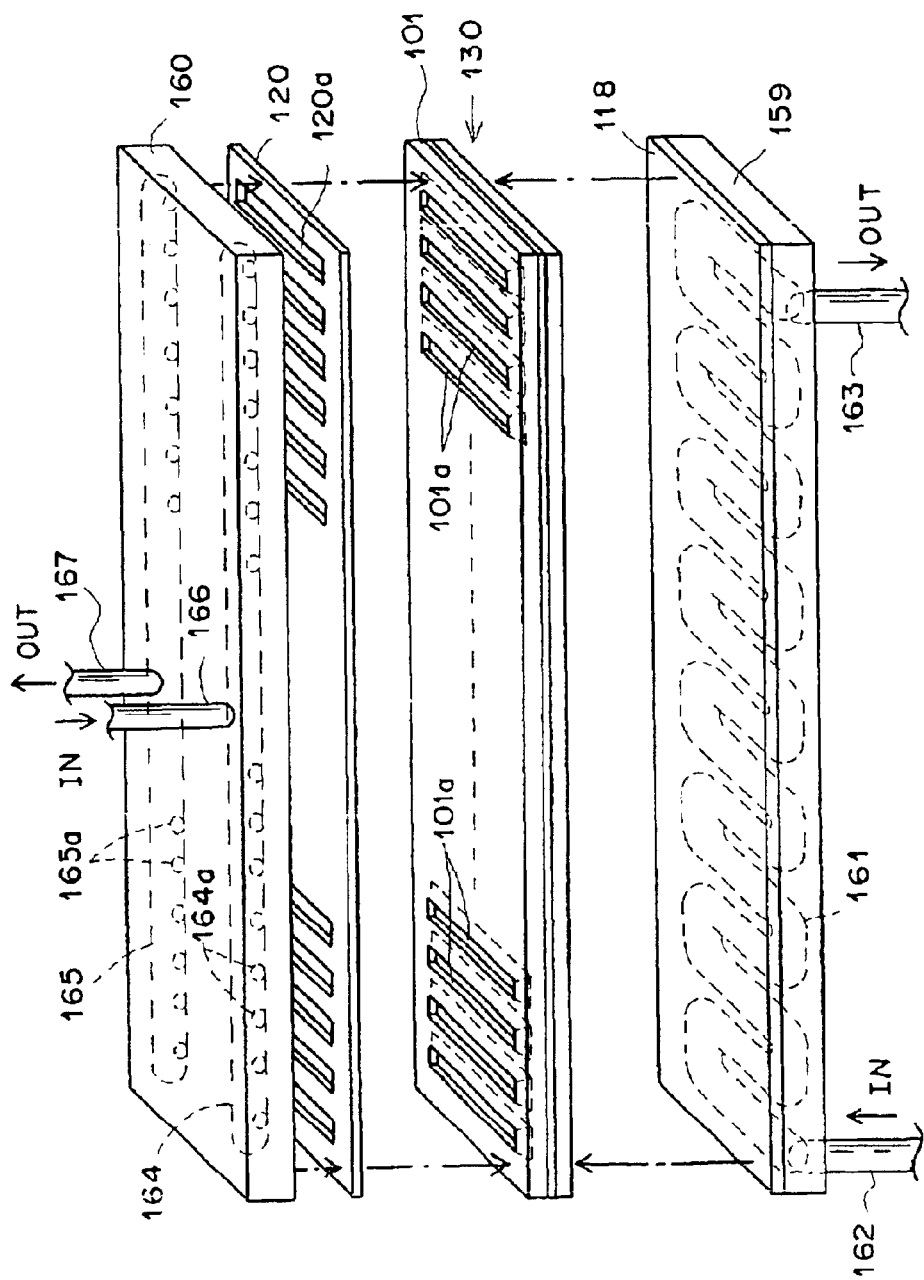
FIG. 18 is an exploded perspective view of the semiconductor laser of the sixth embodiment of the invention.
Figure 19:
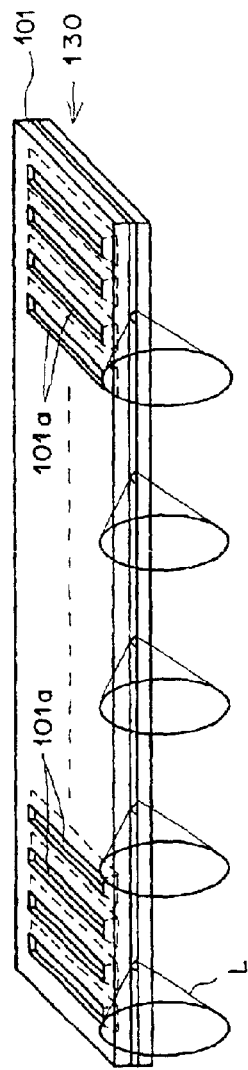
FIG. 19 is a perspective view showing a semiconductor laser array constituting the semiconductor laser of FIG. 18.

The sixth embodiment of the invention will now be explained. FIG. 18 shows the exploded perspective view of the semiconductor laser according to the sixth embodiment of the invention. Also, FIG. 19 shows a perspective view of the semiconductor laser array 130 constituting the semiconductor laser. In FIG. 18 and other related figures, those elements the same as those of FIGS. 14 to 17 are identified with the same numbers (numerals), and if unnecessary, their explanations are omitted.

Figure 20:
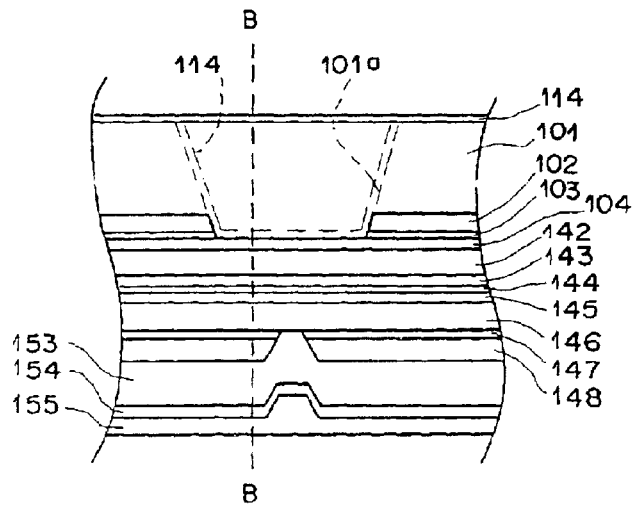
FIG. 20 is a view showing the light-emitting face of the semiconductor laser array of FIG. 19.
Figure 21:
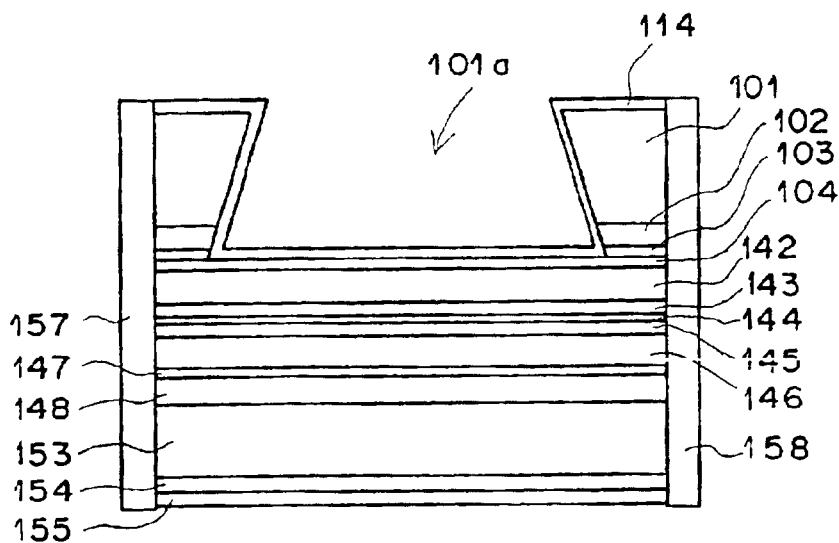
FIG. 21 is a cross-sectional view of the semiconductor laser array of FIG. 19.

The structure of the above-described semiconductor laser array 130, together with the preparation method, will be explained with reference to FIGS. 20 and 21. FIG. 20 shows the shape of the light-emitting face (the end face becoming the resonator face) of one light-emitting portion of the semiconductor laser array 130. FIG. 21 shows the shape of the cross-section taken along the line B—B of FIG. 20.

Successively grown on a (100) n-GaAs substrate 101 are an n-GaAs-buffer layer 102 an n-$In_{0.49}Ga_{0.51}P$ etching-preventing layer 103, an n-GaAs contact layer 104, an n-$In_{0.5}(Ga_{1-z2}Al_{z2})_{0.5}P$ lower clad layer ($0.2 \leq z2 \leq 1$) 142, an n- or i-$In_{0.49}Ga_{0.51}P$ lower optical waveguide layer 143, an $In_{x3}Ga_{1-x3}As_{1-y3}P_{y3}$ quantum well active layer 144 ($0 \leq x3 \leq 0.3$, $0 \leq y3 \leq 0.6$), a p- or i-$In_{0.49}Ga_{0.51}P$ upper optical waveguide layer 145, a p-$In_{0.5}(Ga_{1-z2}Al_{z2})_{0.5}P$ upper clad layer 146, a p-$In_{x4}Ga_{1-x4}As_{1-y4}P_{y4}$ etching-preventing layer ($0 \leq x4 \leq 0.3$, $0 \leq y4 \leq 0.6$) 147, an n-$In_{0.5}(Ga_{1-z3}Al_{z3})_{0.5}P$ current constricting layer ($0.1 \leq z3 \leq z2$) 148, and an n-GaAs cap layer (not shown), using an organometallic vapor phase growing method.

Thereafter, after applying a resist (not shown) onto the above-described GaAs cap layer, the resist region of a stripe form having a width of about 3 μm is removed in the direction parallel to the substrate orientation flat and vertical to the cleaved face of a laser, using an ordinary lithographic method. Using the resist having the stripe-form opening as a mask, the above-described GaAs cap layer is removed in a stripe form with a tartaric acid etchant.

Then, after peeling off the resist, the n-$In_{0.5}(Ga_{1-z3}Al_{z3})_{0.5}P$ current constricting layer 148 is etched with a hydrochloric acid-base etchant using the GaAs cap layer as a mask. Further, the p-$In_{x4}Ga_{1-x4}As_{1-y4}P_{y4}$ etching-preventing layer 147 and the above-described n-GaAs cap layer are removed with a sulfuric acid-base etchant.

Also, a p-$In_{0.5}(Ga_{1-z1}Al_{z1})_{0.5}P$ upper clad layer 153 and a p-GaAs contact layer 154 are grown thereon. The thickness of the upper clad layer 153 is such a thickness that, in a waveguide passageway in the groove at the center portion of the resonator, the refractive index waveguide in a single fundamental mode can be realized even under high output. After a p-side electrode 155 is formed, the substrate 101 is abraded and an insulating film (not shown) having a plurality of stripe-form openings is formed on the substrate side. Also, using the insulating film as a mask, the GaAs substrate 101 is etched in stripe forms by an ECR dry etching using a $Cl_2$ gas to form a plurality of grooves 101a. In this case, the etching is automatically stopped at the n-$In_{0.49}Ga_{0.51}P$ etching-preventing layer 103.

Then, the n-$In_{0.49}Ga_{0.51}P$ etching-preventing layer 103 is removed with a hydrochloric acid-base etching solution. After removing the above-described insulating film, an n-side electrode 114 is formed thereon. Thereafter, the manufacturing process of the semiconductor laser array 130 is completed by forming a high-reflectance coat 157 and a low-reflectance coat 158 at the surface of the resonator of the laser array bar formed by cleaving the sample at the designated positions both end faces.

As shown in the completed form in FIG. 21, the semiconductor laser array 130 comprises of the n-GaAs substrate 101, the n-GaAs-buffer layer 102, the n-$In_{0.49}Ga_{0.51}P$ etching-preventing layer 103, the n-GaAs contact layer 104, the n-$In_{0.5}(Ga_{1-z2}Al_{z2})_{0.5}P$ lower clad layer ($0.2 \leq z2 \leq 1$) 142, the n- or i-$In_{0.49}Ga_{0.51}P$ lower optical waveguide layer 143, the $In_{x3}Ga_{1-x3}As_{1-y3}P_{y3}$ quantum well active layer 144 ($0 \leq x3 \leq 0.3$, $0 \leq y3 \leq 0.6$), the p- or i-$In_{0.49}Ga_{0.51}P$ upper optical waveguide layer 145, the p-$In_{0.5}(Ga_{1-z2}Al_{z2})_{0.5}P$ upper clad layer 146, the p-$In_{x4}Ga_{1-x4}As_{1-y4}P_{y4}$ etching-preventing layer ($0 \leq x4 \leq 0.3$, $0 \leq y4 \leq 0.6$) 147, the n-$In_{0.5}(Ga_{1-z3}Al_{z3})_{0.5}P$ current constricting layer ($0.1 \leq z3 \leq z2$) 148, the p-$In_{0.5}(Ga_{1-z1}Al_{z1})_{0.5}P$ upper clad layer 153, the p-GaAs contact layer 154, the p-side electrode 155, the n-side electrode 114, the high-reflectance coat 157, and the low-reflectance coat 158. As shown in FIG. 19, the semiconductor laser array 130 has a plurality of light-emitting portions arranged in the lengthwise direction of the array with a specified interval between each other, and laser light L is emitted from each light-emitting portion.

As shown in FIG. 18, the semiconductor laser of the embodiment is formed by connecting a copper heatsink 159 to the p-side (the o-side electrode 155 side) of the above-described semiconductor laser array 130 using an In brazing material 118 and connecting a copper-made heatsink 160 to the n-side (the substrate 101 side) using an AuSn brazing material 120.

The heatsink 159 is formed in a size corresponding to the semiconductor laser array 130, and a cooling medium passageway 161 is formed in the inside thereof. The cooling medium passageway 161 is formed in a meandering form such that the passageway passes through substantially all area inside the heatsink 159, and the two ends thereof are respectively opened at opposite end portions in the lengthwise direction of the heatsink 159. Also, insulating tubes 162 and 163 are respectively connected to each opening.

Another heatsink 160 is also formed in a size corresponding to the semiconductor laser array 130, and in the inside thereof, two cooling medium passageways 164 and 165 extending in the lengthwise direction of the heatsink are formed. A plurality of small holes 164a extending to the semiconductor laser array side of the heatsink 160 are opened on the cooling medium passageway 164 at the positions corresponding to a plurality of grooves 101a formed on the substrate 101 of the semiconductor laser array 130. In addition, a plurality of small holes 165a are similarly opened on the other cooling medium passageway 165. The cooling medium passageways 164 and 165 are respectively connected to insulating tubes 166 and 167 in the center portions of the lengthwise direction of the heatsink 160.

On the other hand, the AuSn brazing material 120 connecting the heatsink 160 and the semiconductor laser array 130 have openings 120a in the portions corresponding to the above-described plurality of small holes 64a and 65a. The cooling medium supplied as described below may flow into the above-described grooves 101a via the cooling medium passageways 164 and 165 and then the small holes 164a and 165a.

The insulating tubes 162 and 163 connected to the heatsink 159 are further connected to the same circulator as shown, for example, in FIG. 14. A cooling medium supplied from the circulator flows through the cooling medium passageway 161 in the heatsink 159. Thus, the p-side of the semiconductor laser array 130 is effectively cooled by the cooling medium, and the heat dissipation effect by the heatsink 159 is improved.

Also, the insulating tubes 166 and 167 connected to the heatsink 160 are further connected to a circulator as shown, for example, in FIG. 14. A cooling medium supplied from the circulator flows through the cooling medium passageways 164 and 165 in the heatsink 160. In addition, the cooling medium flows from the insulating tube 66 to the cooling medium passageway 164, the small hole 164a, the inside of the groove 101a, the small hole 165a, the cooling medium passageway 165, and then to the insulating tube 67.

Thus, the n-side of the semiconductor laser array 130 is effectively cooled by the cooling medium and the heat dissipation effect by the heatsink 160 is improved. In this case, the cooling medium flows in a part of the groove 101a directly contacting with the substrate 101 of the semiconductor laser array 130. Thus, the heat dissipation from the semiconductor laser array 130 to the heatsink 160 is carried out sufficiently well via the cooling medium. In this case, water or a similar liquid can be, for example, also suitably utilized as the cooling medium.

Because, the semiconductor laser array 130 is cooled sufficiently well from both the p-side and the n-side via the cooling medium in the embodiment described above, the temperature rising of the semiconductor laser array 130

(more practically, the temperature rising in the vicinity of the quantum well active layer 144) is restrained. Accordingly, a high reliability is insured even under high-output operation while keeping the single transverse mode.

In addition, although the invention is applied to the semiconductor laser of fundamental transverse mode oscillation in the above-described embodiment, the invention can instead be applied to a semiconductor laser having a wide stripe width of at least 3 μm. Also, although the GaAs substrate 101 in the above-described embodiment is an n-type, a p-type conductive substrate may instead be used. In the latter case, all the conductivity types described above may be reversed. Also, the oscillating wavelength band can be controlled within the range of 700 nm to 1200 nm by the composition of the $In_xGa_{1-x}As_{1-y}P_y$ quantum well active layer. Also, by using an InGaAlP-base optical waveguide layer having the band gap smaller than the clad layer, oscillation within the range of 600 nm to 700 nm becomes possible.

Furthermore, the crystal growing method may be a molecular beam epitaxial growing method using a solid or a gas as the raw material.

Also, it is more effective for restraining the COD by the heat generation on the light-emitting face of the semiconductor laser element to locate the opening (i.e., the connecting aperture to the insulating tube 162) of the cooling medium introducing side of the cooling medium passageway 161 formed in the heatsink 59 and the cooling medium passageway 64 formed in the heatsink 160 as close as possible to the light-emitting face.

Also, in the embodiment, although an AuSn brazing material 120, which is free from a problem of being deteriorated with water, is used as a brazing material for connecting the substrate 101 having the groove 101a to the heatsink 160 in the above embodiment, other brazing materials may instead be used as far as the material is resistant to the cooling medium.

Figure 22:
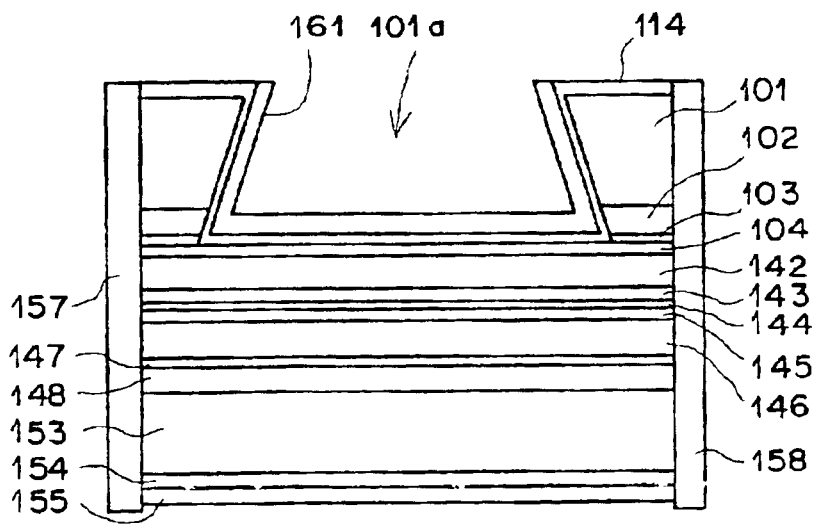
FIG. 22 is a cross-sectional view of a modified embodiment of the semiconductor laser array of FIG. 21.

Furthermore, as shown in FIG. 22, it is desirable that a dielectric film 161 made of $SiO_2$ or SiN, etc., is selectively formed at groove wall portions of the groove 101a having the n-side electrode 114 in such a manner that the film is not formed at the peripheral portions of the groove. For selectively forming the dielectric film 161 as described above, $SiO_2$ or SiN will be successively laminated by a P-CVD method after forming the n-side electrode 114, and thereafter, only the $SiO_2$ film or the SiN film at the periphery of the groove will be removed by BHF using a photolithographic method. When such a dielectric film 161 is formed, the cooling medium is brought into direct contact with the portion of passing the electric current of the semiconductor laser array 130, whereby the occurrence of problems such as short-circuiting, etc., can be prevented.

Also, the shape of the groove formed in the semiconductor laser array is not limited to a rectangle or a comb shape, and other shapes may be employed as long as the similar effects are obtained.

Also, in the case of using the semiconductor laser element of a ridge type, the ridge groove can be utilized as a cooling medium passageway similar to the groove at the substrate-side as described above. In such a case, both the p-side and the n-side of the semiconductor laser element can be effectively cooled. The seventh embodiment of the invention constructed as described above will now be explained.

Figure 23:
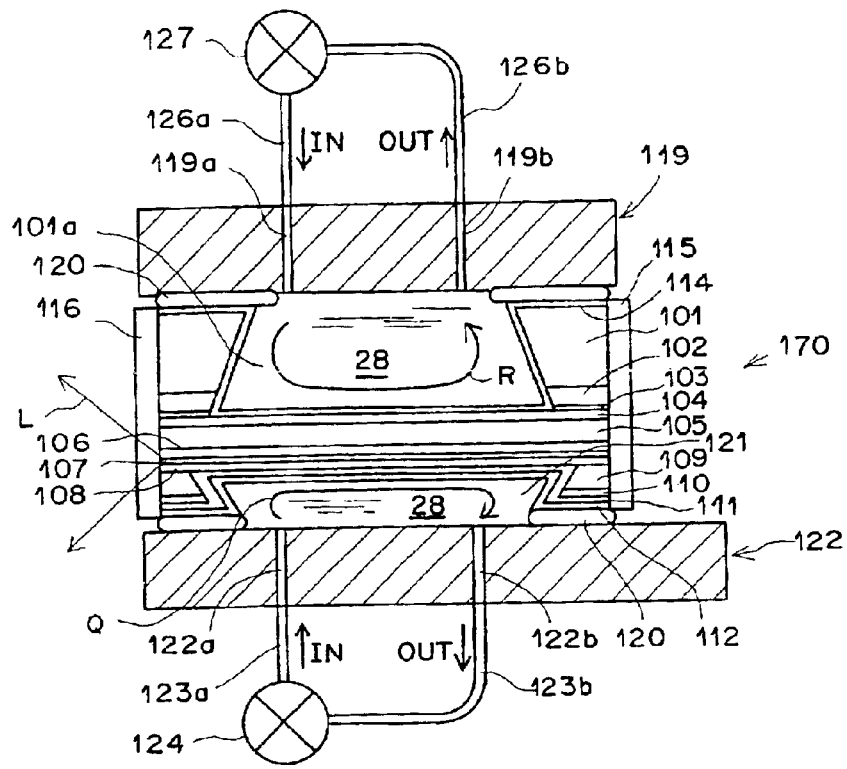
FIG. 23 is a cross-sectional view of the semiconductor laser of the seventh embodiment of the invention.
Figure 24:
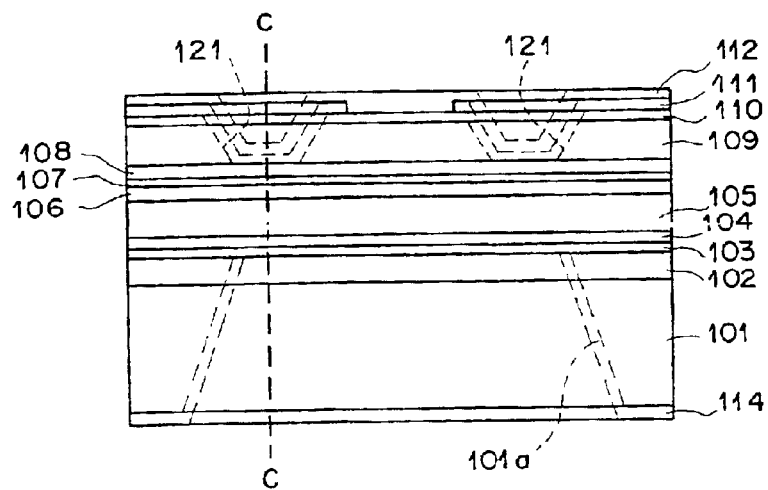
FIG. 24 is a view showing the light-emitting face of the semiconductor laser element constituting the semiconductor laser of FIG. 23.
Figure 25:
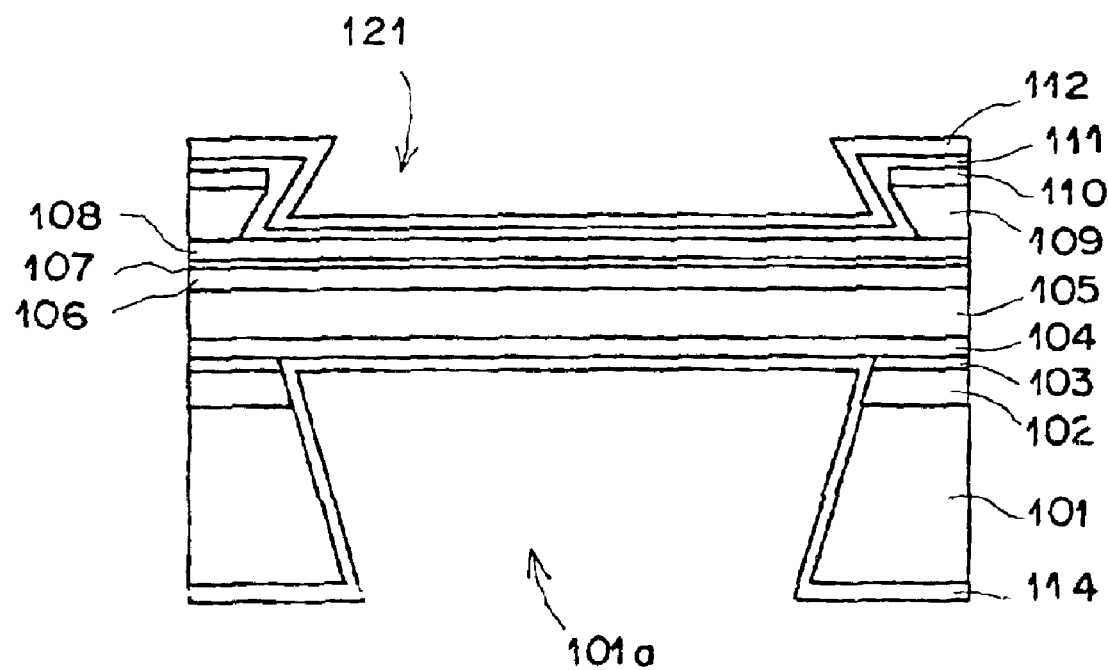
FIG. 25 is a cross-sectional view of the semiconductor laser element of FIG. 24.

FIG. 23 shows the cross-sectional shape of the semiconductor laser of the seventh embodiment of the invention. FIG. 24 shows the end face working as the resonator face, that is, the light-emitting face of the semiconductor laser element 170 constituting the semiconductor laser. FIG. 25 shows the cross-sectional shape (the state during preparation) taken along the line C—C of FIG. 24.

First, by referring to FIGS. 24 and 25, the construction of the semiconductor laser element 170 and the preparation method thereof will be explained. On a (100) n-GaAs substrate 101 there are successively grown an n-GaAs buffer layer 102, an n-$In_{0.49}Ga_{0.51}P$ etching-preventing layer 103, an n-GaAs contact layer 104, an n-$Ga_{1-z1}Al_{z1}As$ lower clad layer 105 ($0.55 \leq z1 \leq 0.8$), an n- or i-$In_{0.49}Ga_{0.51}P$ lower optical waveguide layer 106, an $In_{x3}Ga_{1-x3}As_{1-y3}P_{y3}$ quantum well active layer 107 ($0 \leq x3 \leq 0.3$, $0 \leq y3 \leq 0.6$), a p- or i-$In_{0.49}Ga_{0.51}P$ upper optical waveguide layer 108, a p-$Ga_{1-z1}Al_{z1}As$ upper clad layer 109, and a p-GaAs contact layer 110, by an organometallic vapor-phase growing method.

Thereafter, two ridge grooves 121 extending in the lengthwise direction of the resonator are formed on the p-GaAs contact layer 110 and the upper clad layer 109 using a photolithographic method. These ridge grooves are parallel to the substrate orientation flat. For example, the width of each ridge groove may be 50 μm, and the interval between them may be 200 μm. Also, these ridge grooves 121 are formed so that they end before reaching a portion within 30 μm from the light-emitting face.

After an insulating film 111 is formed thereon, the insulating film 111 is removed in a stripe form having a width of about 200 μm by an ordinary lithographic method. Then, a p-side electrode 112 is formed thereon. While keeping the lengthwise direction of the grooves parallel with the above-described orientation flat, the above-described insulating film is removed from the region between the designated positions of both end faces by a lithographic method. Using the insulating film as a mask, an $SiO_2$ pattern (not shown) having a stripe-form opening is formed. Then, using the $SiO_2$ pattern as a mask, the substrate 101 is etched with a sulfuric acid-base or ammonia-base etchant to form a reverse mesa-form groove 101a. In this case, the etching is automatically stopped at the n-$In_{0.49}Ga_{0.51}P$ etching-preventing layer 103, and GaAs is etched down to the etching-preventing layer 103.

Then, the n-$In_{0.49}Ga_{0.51}P$ etching-preventing layer 103 is removed with a hydrochloric acid-base etching solution. After removing the above-described insulating film, an n-side electrode 114 is formed. Thereafter, the semiconductor laser element 170 shown in FIG. 23 is finally obtained by forming a high-reflectance coat 115 and a low-reflectance coat 116 on the resonator face formed by cleaving the sample at the designated positions of the end faces.

The semiconductor laser element 170 comprises the n-GaAs substrate 101, the n-GaAs buffer layer 102, the n-$In_{0.49}Ga_{0.51}P$ etching-preventing layer 103, the n-GaAs contact layer 104, the n-$Ga_{1-z1}Al_{z1}As$ lower clad layer 105 ($0.55 \leq z1 \leq 0.8$), the n- or i-$In_{0.49}Ga_{0.51}P$ lower optical waveguide layer 106, the $In_{x3}Ga_{1-x3}As_{1-y3}P_{y3}$ quantum well active layer 107 ($0 \leq x3 \leq 0.3$, $0 \leq y3 \leq 0.6$), the p- or i-$In_{0.49}Ga_{0.51}P$ upper optical waveguide layer 108, the p-$Ga_{1-z1}Al_{z1}As$ upper clad layer 109, the p-GaAs contact layer 110, the insulating film 111, the p-side electrode 112, the n-side electrode 114, the high-reflectance coat 115, and the low-reflectance coat 116.

The semiconductor laser element 170 emits laser light L from the end face applied with the above-described low-reflectance coat 116. In addition, the active layer may be any of a compression set type, a lattice matching type, and a tensile strain quantum well type.

As shown in FIG. 23, the semiconductor laser of the embodiment is constituted of the semiconductor laser element 170, a copper heatsink 122 connected to the p-side of the semiconductor laser element 170 by an AuSn brazing material 120, insulating tubes 123a and 123b each connected to a cooling medium supply passageway 122a and cooling medium discharge passageway 122b respectively passing through the heatsink 122, a circulator connected to these insulating tubes 123a and 123b, a copper heatsink 119 connected to the n-side (that is, the substrate 101) of the semiconductor laser element 170 via an AuSn brazing material 120, insulating tubes 126a and 126b, each connecting to a cooling medium supply passageway 119a and cooling medium discharge passageway 119b respectively passing through the heatsink 119, and a circulator 127 connected to these insulating tubes 126a and 126b.

In the semiconductor laser, the reverse mesa-form groove 101a formed on the substrate 101 is closed by the heatsink 119, and the groove 101a constitutes the cooling medium passageway having the substrate 101 and the heatsink 119 as the passage walls. The cooling medium 128 circulated by the above-described circulator 127 flows through the cooling medium passageway, and the semiconductor laser element 170 is cooled by the cooling medium 128.

Also, in the semiconductor laser, two ridge grooves 121 are closed by the heatsink 122 and these ridge grooves 121 constitute the cooling medium passageways having the semiconductor laser element 170 and the heatsink 122 as the passage walls. The cooling medium 128 circulated by the circulator 124 flows through the cooling medium passageways, and the semiconductor laser element 170 is cooled by the cooling medium 128. In FIG. 23, arrows R and Q show the general flowing directions of the cooling medium 128.

In addition to that the same effects as those in the fifth embodiments shown in FIG. 14 are obtained, the heat dissipation effect in the present embodiment is increased also on the p-side of the semiconductor laser element 170 by the cooling medium 128 entering the ridge grooves 121. Accordingly, the reliability under high-output operation is improved.

In addition, in this case, it is also desirable to form the dielectric film similar to the dielectric film 161 shown in FIG. 22 at the groove wall portions of the reverse mesa-form groove 101 and the ridge grooves 121. Prevented by employing the dielectric film as described above is the occurrence of problems such as short-circuiting, etc., caused by the direct contact of the cooling medium 128 with the portions passing electric current of the semiconductor laser element 170.

Figure 26:
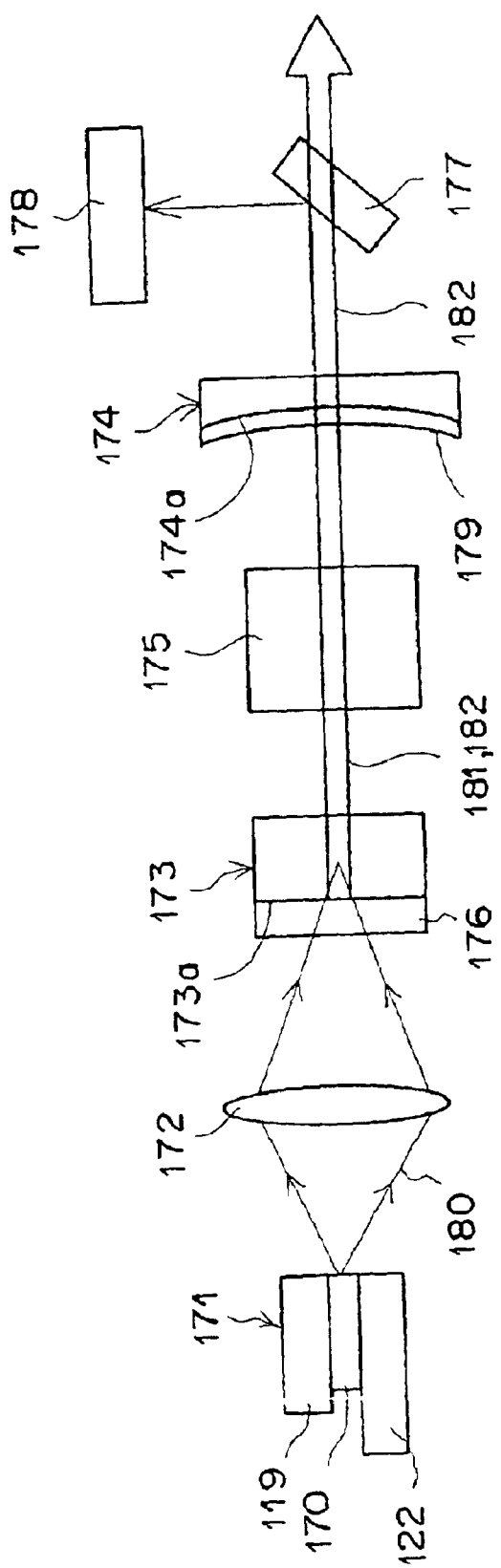
FIG. 26 is a schematic side view of a solid laser apparatus using the semiconductor laser of the invention.

Referring to FIG. 26, an application example of the semiconductor laser of the invention will now be explained. The semiconductor laser 171 used in this case is, for example, the semiconductor laser of the seventh embodiment shown in FIG. 23, which is now used as an exciting light source of a solid laser apparatus generating secondary higher harmonics.

That is, the solid laser apparatus is comprised of the semiconductor laser, a collective lens 172 collecting a laser light 180 as an excited light emitted from the semiconductor laser, a solid laser crystal 173 excited by the collected laser light 180, an output mirror 174 consisting of a concave mirror constituting a solid laser resonator together with the solid laser crystal 173, and a nonlinear optical crystal 175 disposed between the solid laser crystal 173 and the output mirror 174.

Used as the solid laser crystal 173 is, for example, Nd:YAG, Nd:YLF, etc. Used as the nonlinear optical crystal 175 is, for example, a $KNbO_3$ crystal, a KTP crystal, a $LiNbO_3$ crystal having a periodic domain inversion structure, etc.

Also, the temperatures of the semiconductor laser 171, the solid laser crystal 173, and the nonlinear optical crystal 175 are adjusted to specified temperatures using Peltier elements and temperature-controlling circuits (not shown).

Formed on an end face 73a on the excited light incident side of the above-described solid laser crystal 173 is a coat film 176, which transmits the laser light 180 well and reflects a solid laser light 181 and the secondary higher harmonics 182 described below well. On the other hand, formed on a mirror face 174a of the output mirror 174 is a coat film 179, which reflects the above-described laser light 180 and the solid laser light 181 well and transmits some of the secondary harmonics 182.

In the above-described structure, the solid laser crystal 173 emits a light excited by the laser light 180. The light resonates between the solid laser crystal facet 173 having the coat film 176 and the mirror face 74a having the coat film 179 to generate the solid laser light 181. The solid laser light 181 enters the non-linear optical crystal 175 and is converted to the secondary harmonics 182 having a wavelength of ½.

From the output mirror 174, substantially only the secondary higher harmonics 182 are emitted, and only those portions of the secondary higher harmonics transmitting a beam splitter 177 are used for a specific use. Also, some portions of the secondary higher harmonics reflected by the beam splitter 177 enter a light-receptive element 178. A light intensity detecting signal output from the light-receptive element 178 enters an APC (automatic power control) circuit (not shown), and the driving electric current of the semiconductor laser element 170 is controlled by the APC circuit so that the light intensity detected by the light-receptive element 178 is kept at a constant level. As a result, the beam splitter 177 transmits a constant level of the light output of the secondary higher harmonics 182 used for a specific use.

Figure 28:
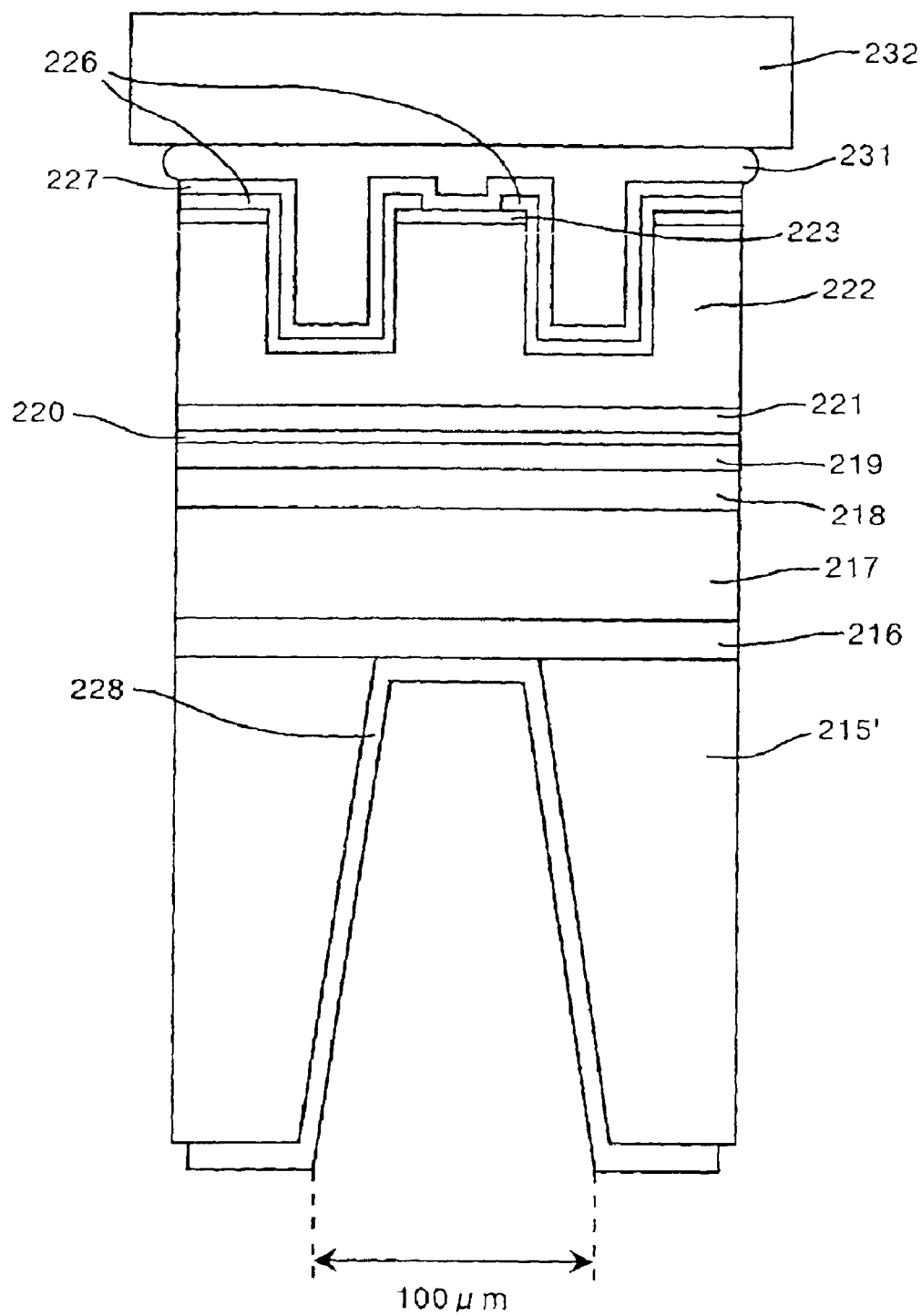
FIG. 28 is a cross-sectional view taken vertical to an outgoing light, showing the semiconductor laser element of the eighth embodiment of the invention.
Figure 29:
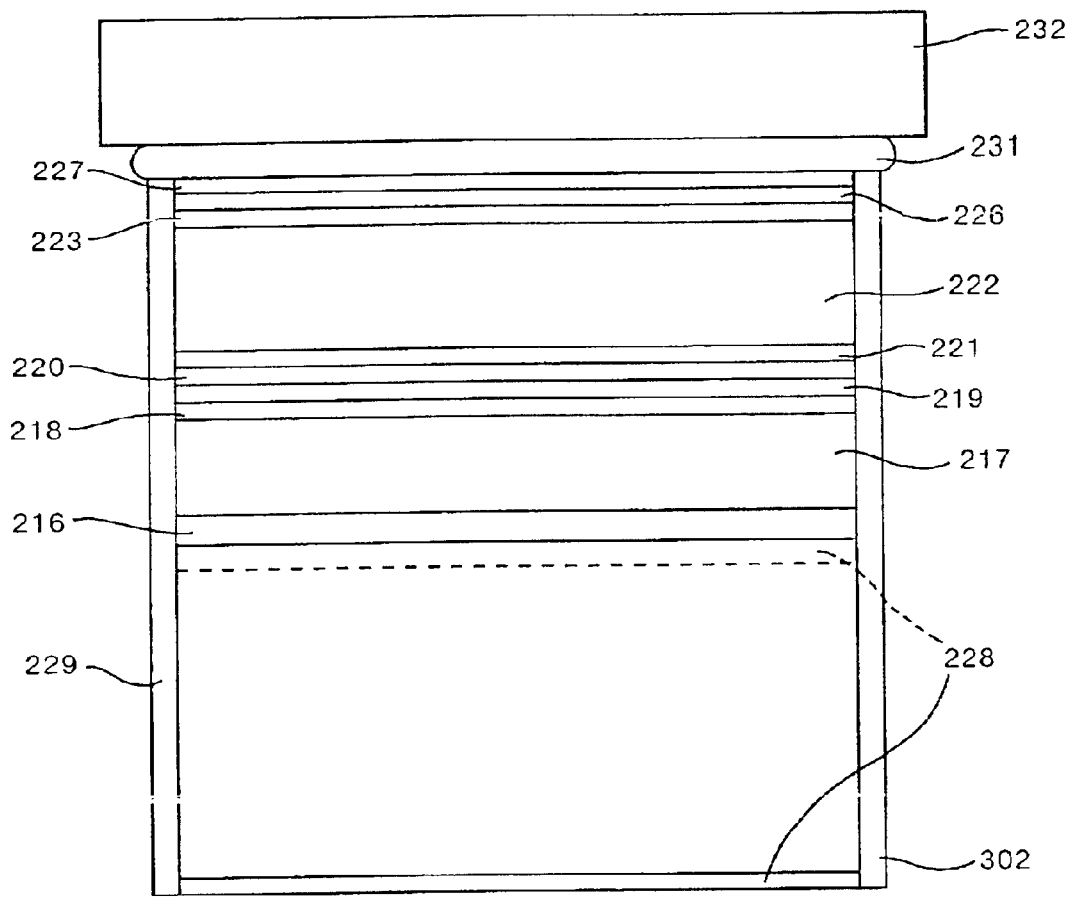
FIG. 29 is a side view showing the semiconductor laser element of the eighth embodiment of the invention.

The semiconductor laser element of the eighth embodiment of the invention will now be explained along with the production method thereof. FIG. 27 shows the cross-sectional view of the production course of the GaNa substrate of the semiconductor laser element. FIG. 28 shows a view of a cross-sectional vertical to the emitting light of the semiconductor laser element. FIG. 29 shows the cross-sectional view of the semiconductor laser element. Trimethyl gallium (TMG), trimethyl indium (TMI), trimethyl aluminum (TMA) and ammonia are used as the raw materials for growing each layer of the semiconductor laser element shown below. A silane gas is used as an n-type dopant gas. Cyclopentadienyl magnesium ($Cp_2Mg$) is used as a p-type dopant.

Figure 27A:
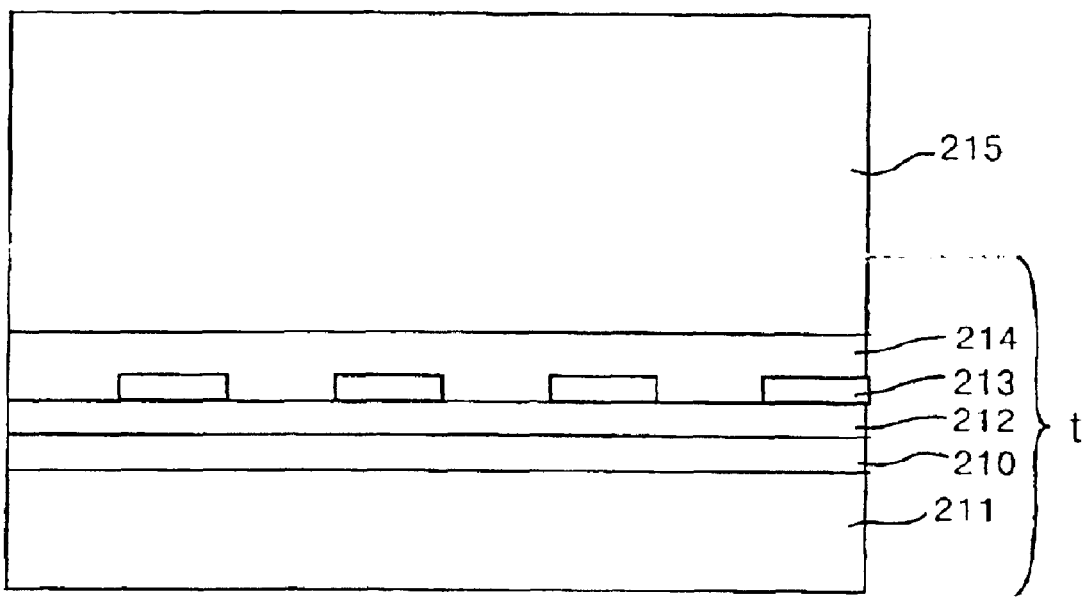
FIGS. 27A and 27B are cross-sectional views showing the preparation process of a GaN substrate.
Figure 27B:
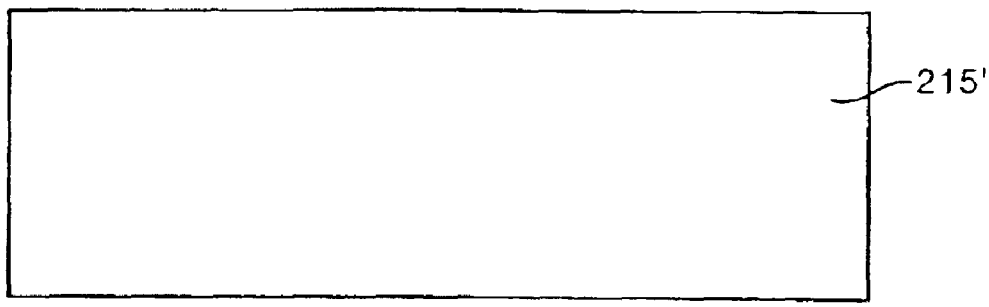

As shown in FIG. 27A, formed on a (0001) C-face sapphire substrate 211 is a GaN low-temperature layer 210 having a film thickness of 30 nm at 500° C., which is formed by an organometallic vapor-phase growing method, and a GaN buffer layer 212 with a film thickness of about 2 μm formed at a low pressure of 100 torr. Then, an $SiO_2$ film 213 is formed thereon with a thickness of 0.1 μm using a P-CVD apparatus. Then, an $SiO_2$ mask pattern having a stripe width of 5 μm is formed with an interval of 10 μm by a photo-etching method. A GaN film 214 having a thickness of about 20 μm is subsequently grown on the $SiO_2$ mask pattern. Furthermore, a non-dope GaN film 215 having a thickness of about 200 μm is laminated at 1000° C. by growing using an HVPE (hydride vapor phase epitaxy) method.

Then, the region of the thickness of "t" is cut and abraded from the back surface of the sapphire substrate 211 to reduce the thickness of the non-dope GaN film 215 grown by the HVPE method to 150 μm. The GaN layer 215 having the thickness of 150 μm is defined as a GaN substrate 215' as shown in FIG. 27.

Then, as shown in FIG. 28, grown on the GaN substrate 215' prepared as described above are an n-GaN contact layer 216, an n-Ga$_{1-z1}$Al$_{z1}$N (thickness 2.5 nm)/GaN super lattice clad layer (thickness 2.5 nm) 217, an n-Ga$_{1-z2}$Al$_{z2}$N optical waveguide layer 218, an In$_{x2}$Ga$_{1-x2}$N (Si-dope)/In$_{x1}$Ga$_{1-x1}$N multilayer quantum well active layer (0.5>x1>x2≧0) 219, a p-Ga$_{1-z3}$Al$_{z3}$N carrier blacking layer 220, a p-Ga$_{1-z2}$Al$_{z2}$N optical waveguide layer 221, a p-Ga$_{1-z1}$Al$_{z1}$N (thickness 2.5 nm)/GaN (thickness 2.5 nm) super lattice clad layer 222, and p-GaN contact layer 223.

Then, an SiO$_2$ film 224 (not shown) and a resist 225 (not shown) are formed, and the resist 225 (not shown) and the SiO$_2$ film 224 (not shown) in the region of two ridge grooves each having a width of 10 μm are removed using an ordinary lithographic method so that a ridge potion having a width of about 2 μm is formed between the ridge grooves each having a width of 10 μm. Then, using a RIE (reactive ion etching) apparatus, by selective etching, etching is applied to a substantially middle portion of the p-Ga$_{1-z1}$Al$_{z1}$N/GaN (thickness 2.5 nm) super lattice clad layer 222 to form two ridge grooves. The residual thickness of the clad layer 222 as a result of the etching is a thickness capable of attaining a fundamental transverse mode oscillation. After removing the resist 225 (not shown) and the SiO$_2$ film 224 (not shown), an insulating film 226 is formed. A portion of the insulating film 226 at the upper portion of the ridge portions is removed with a width of about 2 μm using an ordinary photolithographic etching technique to open an electric current injecting region. Then, a p-electrode 227 made of Ni/Au is formed on the surface of the p-GaN contact layer 223.

Then, on the surface of the GaN substrate 215' there is formed a stripe opening portion having a width of 100 μm parallel to the region corresponding to the electric current injecting region formed on the surface of the p-electrode by a photolithographic method. Using an ECR dry etching method using a Cl$_2$ gas, etching is carried out down to the n-GaN contact layer 216. After peeling off the resist, an n-electrode 228 made of Ti/Al is formed from the inside of the groove toward the surface of the GaN substrate 215'. As shown in FIG. 29, the semiconductor laser element is finally obtained by forming a high-reflectance coat 229 and a non-reflective coat 230 on the resonator faces formed by cleaving the sample prepared as described above to form a chip. Thereafter, the surface of the p-electrode 227 side of the semiconductor laser element is connected to a heatsink 232 using an AuSn brazing material 231.

It is desirable that the composition of AlGaN of each layer described above satisfies the conditions of 1>z1>z2≧0 and 1>z3>z2.

When the equivalent reflectance of the light propagating to the vertical direction in the ridge groove is nA and the equivalent reflectance of the light propagating to the vertical direction to the ridge portion is nB, the equivalent reflectance represented by nB−nA can be controlled within the range of 7×10$^{-3}$>nB−nA>1.5×10$^{-3}$ by adjusting the thickness of the clad layer at the lower portion of the ridge groove.

In the semiconductor laser element of the embodiment, as shown in FIG. 29, the groove on the GaN substrate 215' is formed in the region corresponding to the current injecting region formed in the ridge portion. The groove has a width of 100 μm which is wider than the width (2 μm) of the current injecting region, and ranges over the length from one end face applied with the reflecting film coat to the other end face.

In addition, in the semiconductor laser element, an n-electrode 228 is formed on the surface of the groove.

Because the n-electrode 228 is disposed directly below the p-electrode 227, the electric current injected from the p-electrode 227 side flows uniformly to the active layer. Accordingly, it becomes possible to obtain a stable oscillation beam having the light density of a Gauss-type distribution. Also, by forming a direct contact between the n-electrode 228 and the n-GaN contact layer 216, the contact resistance can be reduced, whereby the heat generation of the semiconductor laser element can be further reduced.

Because connection to the heatsink is realized at the p-electrode face near the active layer, the cooling effect against the heat generation of the semiconductor laser element is better than that of the prior art with n-electrode mounting. Accordingly, the laser light emission of a high quality can be realized even under high-output operation, wherein the light output has the Gauss-type distribution.

Also, as the insulating film 226, SiN may be used in place of SiO$_2$. In the case of using SiN, where the film is more minute, the occurrence of the leakage of electric current by defects, etc., can be reduced, and the yield can be improved.

Also, because the n-electrode is formed at the position near the active layer, the cooling effect is improved and a high reliability can be obtained even under high-output operation.

Figure 30:
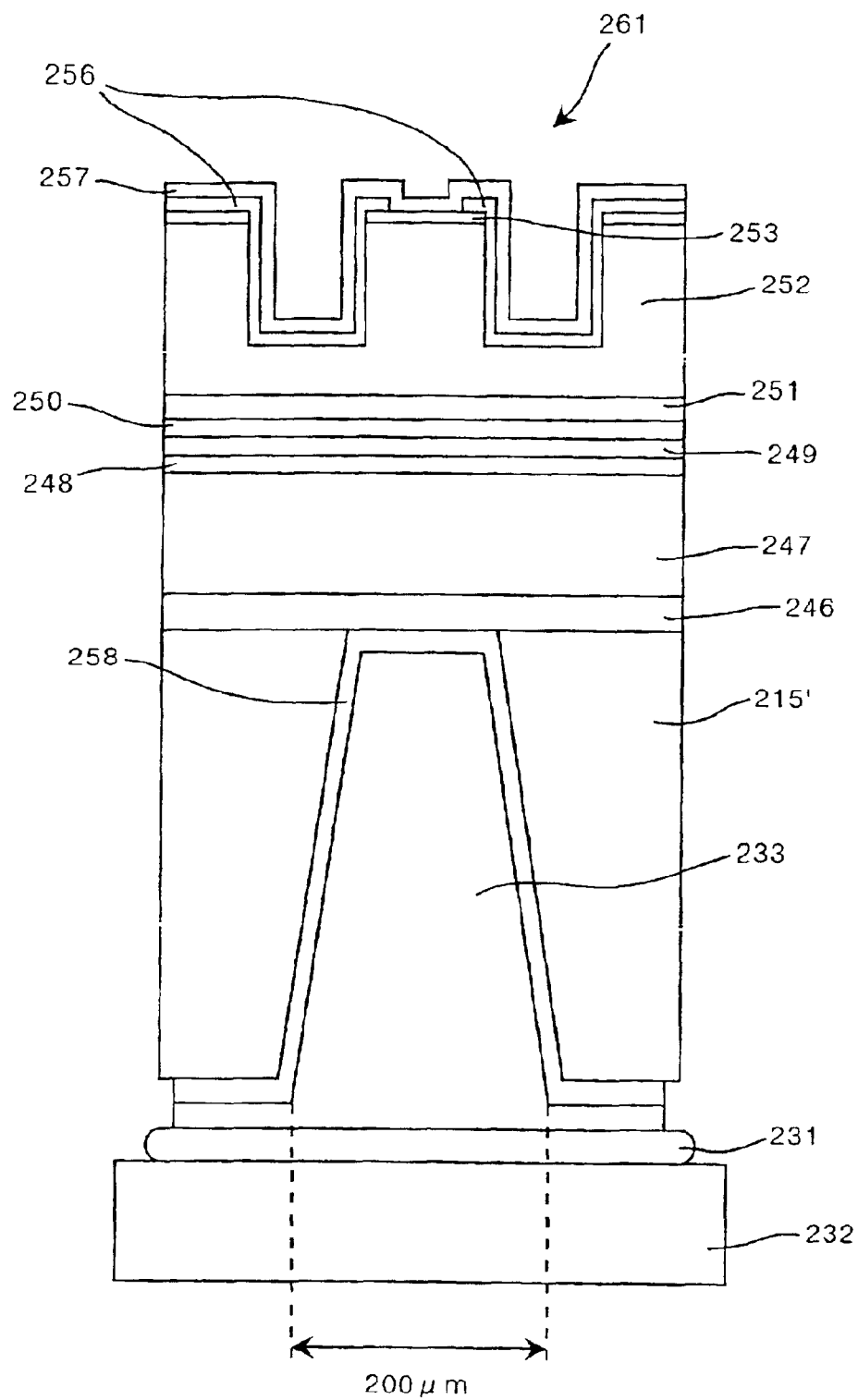
FIG. 30 is a cross-sectional view taken vertical to an outgoing light, showing the semiconductor laser element of the ninth aspect of the invention.
Figure 31:
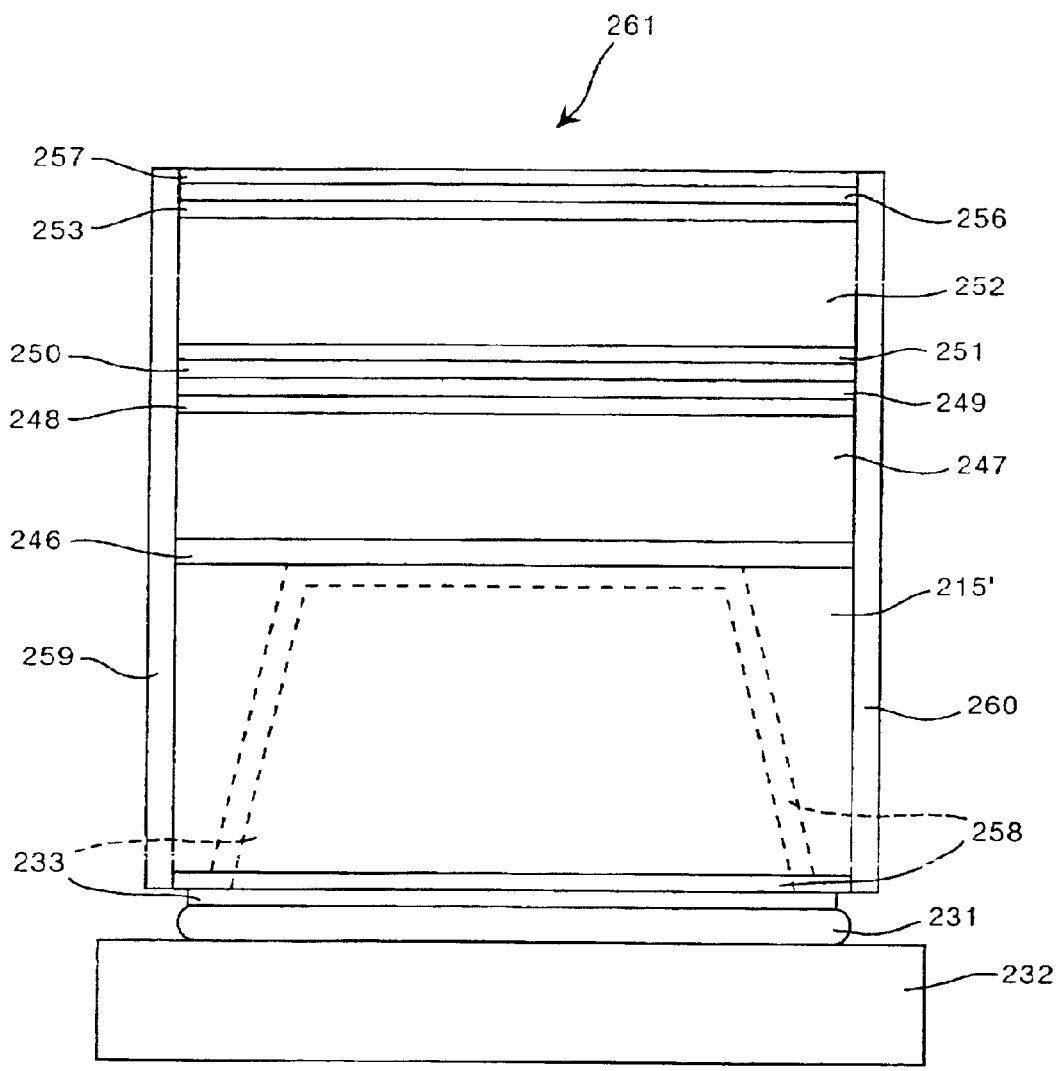
FIG. 31 is a side view showing the semiconductor laser element of the ninth embodiment of the invention.

The semiconductor laser element of the ninth embodiment of the invention and the production method thereof will now be explained. FIG. 30 shows a view a cross-section vertical to the emitting light of the semiconductor laser element. FIG. 31 shows the side view of the semiconductor laser element. As the raw material for growing each layer, trimethyl gallium (TMG), trimethyl indium (TMI), trimethyl aluminum (TMA) and ammonia are used. A silane gas is used as an n-type dopant gas. Cyclopentadienyl magnesium (Cp$_2$Mg) is used as a p-type dopant gas. As the GaN substrate, the GaN substrate 215' prepared in the above-described first embodiment is used. As shown in FIG. 30, grown on the GaN substrate 215' are an n-GaN contact layer 246, an n-Ga$_{1-z1}$Al$_{z1}$N (thickness 2.5 nm)/GaN super lattice clad layer (thickness 2.5 nm) 247, an n-Ga$_{1-z2}$Al$_{z2}$N optical waveguide layer 248, an In$_{x2}$Ga$_{1-x2}$N (Si-dope)/In$_{x1}$Ga$_{1-x1}$N multilayer quantum well active layer (0.5>x1>x2≧0) 249, a p-Ga$_{1-z3}$Al$_{z3}$N carrier blacking layer 250, a p-Ga$_{1-z2}$Al$_{z2}$N optical waveguide layer 251, a p-Ga$_{1-z1}$Al$_{z1}$N (thickness 2.5 nm)/GaN (thickness 2.5 nm) super lattice clad layer 252, and a p-GaN contact layer 253. Then, an SiO$_2$ film 254 (not shown) and a resist 255 (not shown) are formed. Portions of the resist 255 (not shown) and the SiO$_2$ film 254 (not shown) within the region of two ridge grooves, each having a width of 10 μm, are removed so that a ridge potion having a width of about 50 μm is formed between the ridge grooves by an ordinary lithographic method. Then, using an RIE (reactive ion etching) apparatus, selective etching is applied to a substantially middle portion of the p-Ga$_{1-z1}$Al$_{z1}$N/GaN (thickness 2.5 nm) super lattice clad layer 252 to form a ridge groove. The residual thickness of the clad layer as a result of the etching is a thickness capable of attaining a fundamental transverse mode oscillation. After removing the resist 255 (not shown) and the SiO$_2$ film 254 (not shown), an SiO$_2$ film 256 is formed. A portion of the SiO$_2$ film 256 having a width of 50 μm at the ridge portion is removed by an ordinary photolithographic etching technique to open an electric current injecting region. Then, a p-electrode 257 made of Ni/Au is formed on the surface of the p-GaN contact layer 253.

Then, on the GaN substrate 215' there is formed an opening portion which has a width of 200 μm and which is parallel to the region corresponding to the current injection regions formed on the surface of the p-electrode 257. Then, using the ECR dry etching method with a $Cl_2$ gas, etching is carried out down to the n-GaN contact layer 246. As shown in FIG. 30, the groove is formed in a mesa form viewed from the side (shown by dotted lines) at a portion between one end face and the other end face.

Then, after peeling off the resist, an n-electrode 258 is formed from the inside of the groove forward the back surface of the GaN substrate 215. Thereafter, a solvent containing the Au material as shown in Japanese Unexamined Patent Publication No. 10(1998)-22574 is filled in the groove using a spin coating method followed by annealing at about 400° C. for 30 minutes. Accordingly, a flatly filled Au layer 233 is formed in the groove portion. Then, the semiconductor laser element 261 is finally obtained by forming a high-reflectance coat 259 and a non-reflective coat 260 on the resonator faces formed by cleaving the sample to form a chip. Thereafter, the side surface of the n-electrode 258 is connected to the heatsink 232 using an AuSn brazing material 231.

It is desirable that the composition of AlGaN of each of the above-described layers satisfies the conditions of $1>z1>z2\geqq0$ and $1>z3>z2$.

Also, when the equivalent reflectance of the light propagating in the vertical direction in the ridge groove portion is nA and the equivalent reflectance of the light propagating to the vertical direction to the ridge portion is nB, the equivalent reflectance represented by nB−nA can be controlled within the range of $7\times10^{-3}>nB-nA>1.5\times10^{-3}$ by adjusting the thickness of the clad layer at the lower portion of the ridge groove.

In the semiconductor laser of the embodiment of the invention, the electric current injected from the p-electrode 257 side can be uniformly transferred to the active layer by bringing the n-electrode into direct contact with the n-GaN contact layer 246 exposed by partially etching the GaN substrate 215'. This realizes, even in the high-output semiconductor laser element having a ridge stripe of 50 μm in width, low-noise oscillation characteristics even with multimode oscillation. Furthermore, because the groove formed in the GaN substrate 215' is filled with the Au material and is flattened, connection thereof to a heatsink may be made uniform. Thus, the cooling effect on the semiconductor laser element is improved to realize laser light emission of high reliability even under high-output operation.

In addition, although the shape of the groove is a mesa form with the GaN substrate placed there under in the semiconductor laser element of the embodiment, the invention is not limited to this shape and the groove may be a reverse mesa form or a rectangular shape.

Figure 32:
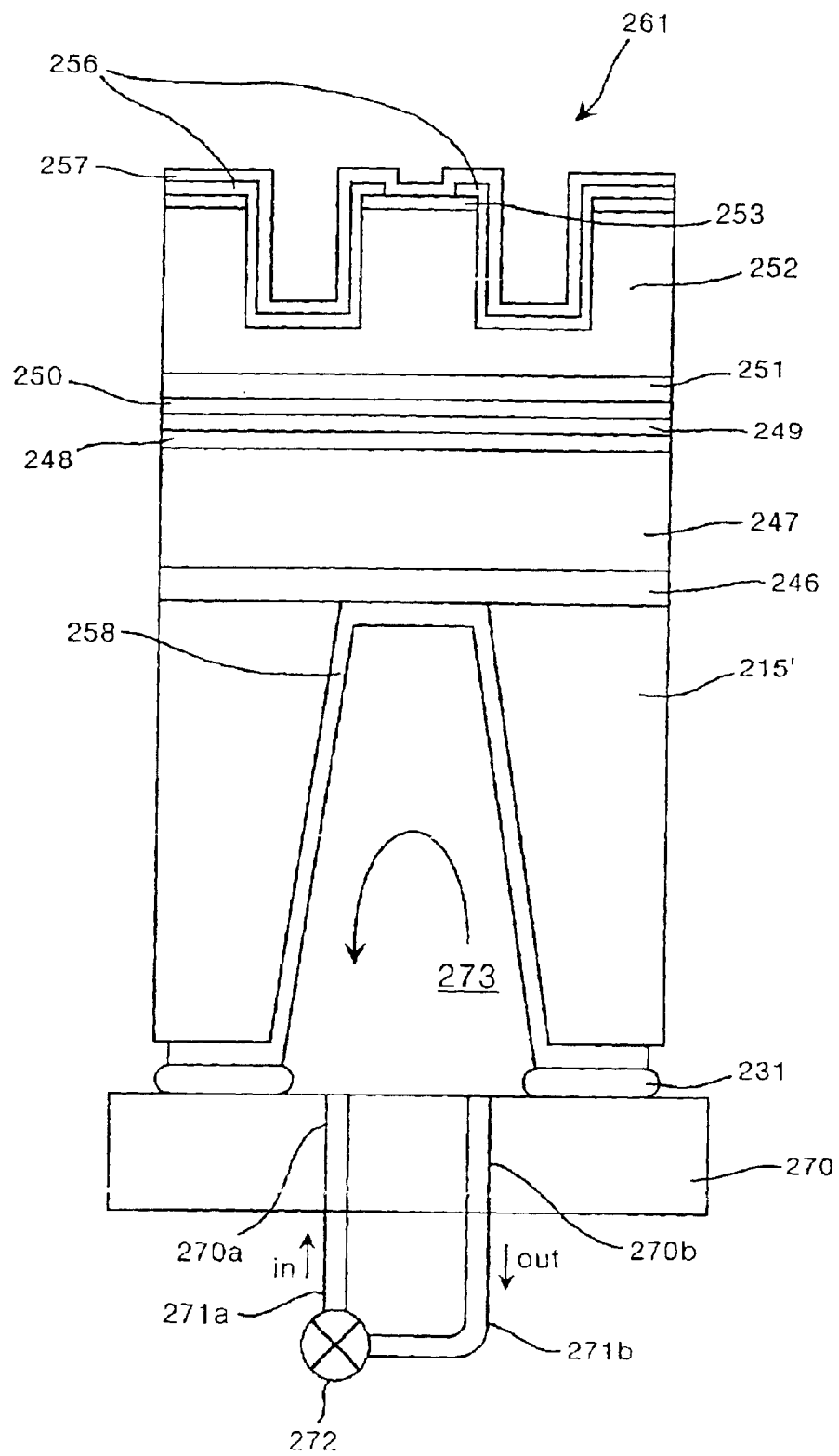
FIG. 32 is a cross-sectional view taken vertical to an outgoing light, showing the semiconductor laser element of the tenth embodiment of the invention.

The semiconductor laser of the tenth embodiment of the invention will now be explained. FIG. 32 shows a view of a cross-section vertical to the emitting light of the semiconductor laser. The semiconductor laser is the semiconductor laser element 261 of the above-described ninth embodiment further equipped with a heatsink having a passageway for a cooling medium and means for causing a cooling medium to flow.

As shown in FIG. 32, the semiconductor laser of the embodiment of the invention is comprised of the semiconductor laser element 261, a heatsink 270 connected to the n-electrode 258 side of the semiconductor laser element 261 using an AuSn brazing material 231, insulating tubes 271a and 271b respectively connected to a cooling medium supply passageway 270a and a cooling medium discharge passageway 270b each passing through the heatsink, and a circulator 272 connected to the insulating tubes.

In the semiconductor laser, the mesa-form groove formed the GaN substrate 215' is ended by the heatsink 270. The groove works as the cooling medium passageway defined by the n-electrode 258 and the heatsink 270. Through the cooling medium passageway, the cooling medium 273 circulated by the above-described circulator 272 flows, and the semiconductor laser element 261 is cooled by the cooling medium 273. An arrow in the groove shows the general flowing direction of the cooling medium 273. In addition, for example, water or a similar liquid can be suitably utilized as the cooling medium.

In the structure, the cooling medium 273 flows in direct contact with the semiconductor laser element 261 and the heatsink 270. Thus, the heat dissipation from the semiconductor laser element 261 to the heatsink 270 is carried out sufficiently well via the cooling medium. Accordingly, the temperature rising of the semiconductor laser element 261 (more practically, the temperature in the vicinity of the quantum well active layer) is restrained, and a high reliability is obtained even under high-output operation.

Also, a heatsink may be connected to the front surface of the p-electrode side.

Because the semiconductor laser element and the laser of the invention emit a beam of high quality and high reliability having a Gauss-type distribution from a low output to a high output, they can be applied as the light sources in the fields of high-speed processing and communication for information or image, instrumentation, medical treatment, and printing.

What is claimed is:

1. A semiconductor laser element comprising a substrate, a plurality of semiconductor layers, including at least an active layer, formed on the substrate, and a first concave portion formed on one surface of the substrate, said one surface being opposite to the other surface having the semiconductor layers formed thereon, wherein the first concave portion is filled with a metal having a heat conductivity higher than the substrate, and wherein the depth of the first concave portion is at least equal to the thickness of the substrate.

2. A semiconductor laser element comprising a substrate, a plurality of semiconductor layers formed on the substrate, and a first concave portion formed on at least a part of one surface of the semiconductor layer, said one surface being the surface further from the substrate, wherein the first concave portion is filled with a metal having a heat conductivity higher than the semiconductor layer.

3. The semiconductor laser element according to claim 2, wherein a second concave portion is formed on one surface of the substrate, said one surface being opposite to the other surface having the semiconductors layers formed thereon, and wherein said second concave portion is filled with a metal having a heat conductivity higher than the substrate.

4. The semiconductor laser element according to any of claims 1 to 3, wherein the first concave portion has a reverse mesa form in a direction vertical to a light-emitting face.

5. The semiconductor laser element according to any of claims 1 to 3, wherein a heatsink is connected to the metal filled in the concave portion.

6. The semiconductor laser element according to any of claims 1 to 3, wherein a plurality of light-emitting portions are formed on the semiconductor layer to form a semiconductor laser array.

7. The semiconductor laser element according to any of claims 1 to 3, wherein said semiconductor laser element is a light source for exciting a solid laser.

8. A semiconductor laser element comprising:

a GaN substrate equipped with one of a pair of electrodes, a semiconductor layer made of a GaN-base semiconductor including at least an active layer, said semiconductor layer disposed on the GaN substrate, and the other one of the pair of electrodes disposed on the semiconductor layer, and an electric current injection region formed on the semiconductor layer, wherein a groove is formed on one surface of the GaN substrate at a region thereon corresponding to the electric current injecting region, said one surface being the surface further from the semiconductor layer, said groove reaching to the depth of the semiconductor layer, and wherein said one of the pair of electrodes is formed on the surface of the groove, wherein a contact layer is formed on the GaN substrate side of the semiconductor layer, wherein the contact layer is ohmic-connected to the electrode formed on the surface of the groove, wherein the groove is filled with a metal having a heat conductivity higher than the GaN substrate, wherein the surface having the groove is flattened, and wherein, a heatsink is connected to the flattened surface.

9. The semiconductor laser element according to claim 8 wherein the metal is Au.

10. A semiconductor laser element comprising a substrate, a plurality of semiconductor layers, including at least an active layer, formed on the substrate, and a groove formed on one surface of the substrate, said one surface being opposite to the other surface having the semiconductor layers formed thereon, wherein the groove extends to the depth of the substrate, and wherein the groove is filled with a metal having a heat conductivity higher than the substrate.

* * * * *